US012751126B2

United States Patent
(12) United States Patent
Wu

(10) Patent No.: US 12,751,126 B2
(45) Date of Patent: Sep. 29, 2026

(54) DISPLAY PANEL AND METHOD FOR REPAIRING THEREOF, AND DISPLAY DEVICE COMPRISING THE SAME

(71) Applicant: TIANMA ADVANCED DISPLAY TECHNOLOGY INSTITUTE (XIAMEN) CO., LTD., Xiamen (CN)

(72) Inventor: Yingying Wu, Xiamen (CN)

(73) Assignee: TIANMA ADVANCED DISPLAY TECHNOLOGY INSITUTE (XIAMEN) CO., LTD., Xiamen (CN)

( * ) Notice: Subject to any disclaimer, the term of this patent is extended or adjusted under 35 U.S.C. 154(b) by 307 days.

(21) Appl. No.: 18/757,554

(22) Filed: Jun. 28, 2024

(65) Prior Publication Data

US 2024/0355988 A1 Oct. 24, 2024

(30) Foreign Application Priority Data

Nov. 7, 2023 (CN) ......................... 202311474303.2

(51) Int. Cl.
*H10H 20/857* (2025.01)
*H10H 20/01* (2025.01)
*H10W 90/00* (2026.01)

(52) U.S. Cl.
CPC .......... *H10H 20/857* (2025.01); *H10W 90/00* (2026.01); *H10H 20/0364* (2025.01)

(58) Field of Classification Search
CPC .. H10H 20/01; H10H 20/032; H10H 20/8316; H10K 71/861; G09F 9/33
See application file for complete search history.

(56) References Cited

U.S. PATENT DOCUMENTS

2021/0202788 A1* 7/2021 You ........................ H10H 20/01
2023/0268458 A1* 8/2023 Li .......................... H10H 20/01
257/79

* cited by examiner

*Primary Examiner* — Khiem D Nguyen
(74) *Attorney, Agent, or Firm* — KILPATRICK TOWNSEND & STOCKTON LLP

(57) ABSTRACT

A display panel, a method for repairing thereof, and a display device. The display panel includes multiple electrode groups including an initial electrode and a redundant electrode. The initial electrode includes a first electrode, an intermediate electrode and a second electrode, which form a first initial electrode pair and a second initial electrode pair. Light-emitting devices connected to the above initial electrode pairs are connected in series; the redundant electrode includes a first redundant electrode, an intermediate redundant electrode and a second redundant electrode, which form a first redundant electrode pair and a second redundant electrode pair; and/or, which form a third redundant electrode pair; the first redundant electrode and the first electrode have the same electric potential, the intermediate redundant electrode and the intermediate electrode have the same electric potential, and the second redundant electrode and the second electrode have the same electric potential.

25 Claims, 16 Drawing Sheets

DISPLAY PANEL AND METHOD FOR REPAIRING THEREOF, AND DISPLAY DEVICE COMPRISING THE SAME

This application claims priority to Chinese Patent Application No. 202311474303.2, titled "DISPLAY PANEL AND METHOD FOR REPAIRING THEREOF, AND DISPLAY DEVICE COMPRISING THE SAME", filed on Nov. 7, 2023 with the China National Intellectual Property Administration, which is incorporated herein by reference in its entirety.

FIELD

The present disclosure relates to the field of display, and in particular to a display panel and a method for repairing the display panel, and a display device.

BACKGROUND

Micro light-emitting diode (Micro LED) and sub-millimeter light-emitting diode (Mini LED) are increasingly applied in display devices with continuous development, and are usually transferred to display devices through mass transfer.

When a defective pixel occurs in a display panel, for example, a certain LED does not emit light, the region where the LED that does not emit light is located is necessary to be repaired. Generally, redundant positions are provided in the display panel, and redundant light-emitting devices are introduced in the redundant positions to replace the non-light-emitting LEDs. However, in conventional pixel repair techniques, it is difficult to realize equal-position repair of the non-light-emitting LEDs, for example, in a certain region, the repairing effect would be affected when the quantity of redundant positions is smaller than the quantity of non-light-emitting LEDs.

SUMMARY

In view of the above, a display panel, a method for repairing thereof, and a display device are provided according to embodiments of the present disclosure. Equal-position repair of a light-emitting device can be realized and the repairing effect can be enhanced.

In one embodiment, a display panel is provided by an embodiment of the present disclosure. The display panel includes multiple electrode groups, where an electrode group of the multiple electrode groups is electrically connected to light-emitting devices; and the electrode group includes an initial electrode and a redundant electrode, where: the initial electrode includes a first electrode, an intermediate electrode, and a second electrode, the first electrode and the intermediate electrode serves as a first initial electrode pair, the second electrode and the intermediate electrode serve as a second initial electrode pair; in at least a part of the multiple electrode groups, the first initial electrode pair and the second initial electrode pair are configured to connect different light-emitting devices respectively, a first light-emitting device connected to the first initial electrode pair and a second light-emitting device connected to the second initial electrode pair are connected in series; the redundant electrode includes a first redundant electrode, an intermediate redundant electrode and a second redundant electrode, where at least one of: the first redundant electrode and the intermediate redundant electrode serve as a first redundant electrode pair, the second redundant electrode and the intermediate redundant electrode serve as a second redundant electrode pair; or the first redundant electrode and the second redundant electrode serve as a third redundant electrode pair; and in the electrode group, the first redundant electrode and the first electrode are both configured to receive a first electric potential, the intermediate redundant electrode and the intermediate electrode are both configured to receive a second electric potential, and the second redundant electrode and the second electrode are both configured to receive a third electric potential.

In one embodiment, a method for repairing the display panel is provided according to an embodiment of the present disclosure. The method includes: transferring two light-emitting devices to the first initial electrode pair and the second initial electrode pair to connect the first initial electrode pair and the second initial electrode pair electrically to the two light-emitting devices, respectively; providing a driving signal to each of the two light-emitting devices to determine whether any of the two light-emitting devices does not emit light; in response to either of the two light-emitting devices not emitting light, binding a redundant light-emitting device to the first redundant electrode pair or the second redundant electrode pair; in response to both of the two light-emitting devices not emitting light, binding two redundant light-emitting devices to the first redundant electrode pair and the second redundant electrode pair, respectively, or, binding a redundant light-emitting device to the third redundant electrode pair where the redundant light-emitting device is electrically connected to both the first redundant electrode and the second redundant electrode.

In one embodiment, a display device is provided according to an embodiment of the present disclosure. The display device includes the display panel in the embodiments.

The display panel and the method for repairing thereof, and the display device according to embodiments of the present disclosure are at least advantageous over the conventional technology in the following embodiments.

In the display panel and the method for repairing thereof, and the display device herein, multiple electrode groups are included. Each electrode group includes an initial electrode and a redundant electrode. The initial electrode is configured to electrically connect to the light-emitting device, the redundant electrode is configured to connect to the redundant light-emitting device when the light-emitting device connected to the initial electrode fails to emit light normally, and the redundant light-emitting device is configured to repair the light-emitting device on the initial electrode. In the initial electrode, a first initial electrode pair formed by the first electrode and the intermediate electrode is configured to connect one light-emitting device, and a second initial electrode pair formed by the second electrode and the intermediate electrode is configured to connect another light-emitting device, and the two light-emitting devices corresponding to the initial electrode are connected in series. Redundant electrodes are introduced in embodiments of the present disclosure. The first redundant electrode and the intermediate redundant electrode in the redundant electrode form a first redundant electrode pair, the second redundant electrode and the intermediate redundant electrode form a second redundant electrode pair. In one embodiment, the first redundant electrode and the third redundant electrode form a third redundant electrode pair. When the light-emitting device on one initial electrode pair in the same electrode group fails to emit light normally, a first redundant light-emitting device may be introduced on the first redundant electrode pair or the second redundant electrode pair, and the first redundant light-emitting device may be configured to replace the light-emitting device in the initial electrode pair to emit light. When the two light-emitting devices on the two initial electrode pairs in the same electrode group do not emit light, two first redundant light-emitting devices may be introduced and connected to the first redundant electrode pair and the second redundant electrode pair respectively, and the two first redundant electrodes may be configured to replace the two light-emitting devices that fail to emit light normally; or, a second redundant light-emitting device with a larger size may be introduced and connected to the third redundant electrode pair. The second redundant light-emitting device with a larger size may be configured to replace the two light-emitting devices that fail to emit light normally. Therefore, when one or two light-emitting devices on the initial electrode pair in the electrode group cannot emit light normally, there are redundant electrode pairs to set up redundant light-emitting devices to replace the light-emitting devices that cannot emit light normally, thereby equal-position repair of the light-emitting devices can be realized, which is conducive to enhancing the repair effect of the display panel.

Any product according to embodiments of the present disclosure does not necessarily to achieve all the above-described effects at the same time.

Other embodiments of the present disclosure and advantages thereof will become clear through the following detailed description of exemplary embodiments of the present disclosure with reference to the drawings.

BRIEF DESCRIPTION OF THE DRAWINGS

Drawings, which are incorporated in and form a part of the specification, illustrate embodiments of the present disclosure and are configured to explain the principles of the present disclosure together with their description.

DETAILED DESCRIPTION

Figure 1:
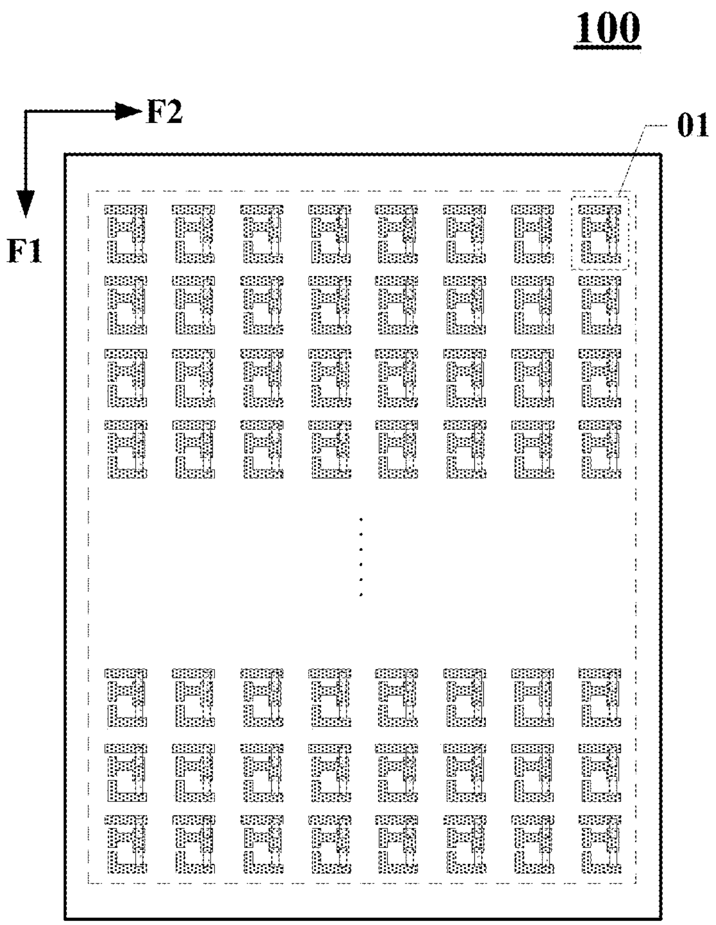
FIG. 1 is a schematic structural diagram of a display panel according to an embodiment of the present disclosure.

Various exemplary embodiments of the present disclosure are described in detail with reference to the drawings. It should be noted that the relative arrangement of the devices and steps, numerical expressions and numerical values set forth in the embodiments are not intended to limit the scope of the present disclosure.

The description of the exemplary embodiments is only illustrative rather than a limitation to the present disclosure and application or usage thereof.

Techniques, methods and apparatus known to those skilled in the art may not be discussed in detail, but where appropriate, the techniques, methods and apparatus should be considered as a part of the specification.

In all of the examples shown and discussed herein, any specific values are construed as illustrative only and not a limitation. Thus, other examples of the exemplary embodiments may have different values.

Various modifications and changes may be made to the present disclosure without departing from the spirit or the scope of the present disclosure. Thus, the present disclosure is intended for covering modifications and variations made thereto, which fall within the scope of the corresponding claims (embodiments as claimed) and their equivalents. Embodiments of the present disclosure can be combined as long as they do not contradict with each other.

It should be noted that similar reference numerals and letters indicate similar items in the following drawings, and therefore, once an item is defined in one drawing, it is not necessary to be further discussed in the subsequent drawings.

Figure 2:
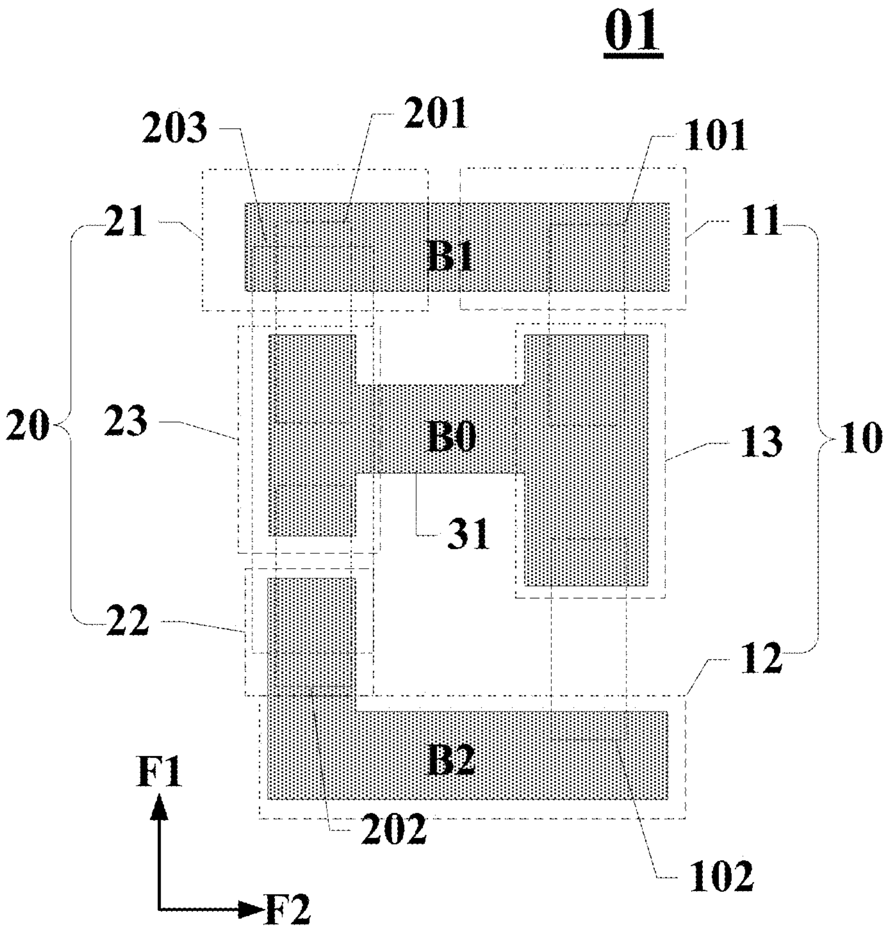
FIG. 2 is a schematic structural diagram of an electrode group in a display panel according to an embodiment of the present disclosure.
Figure 3:
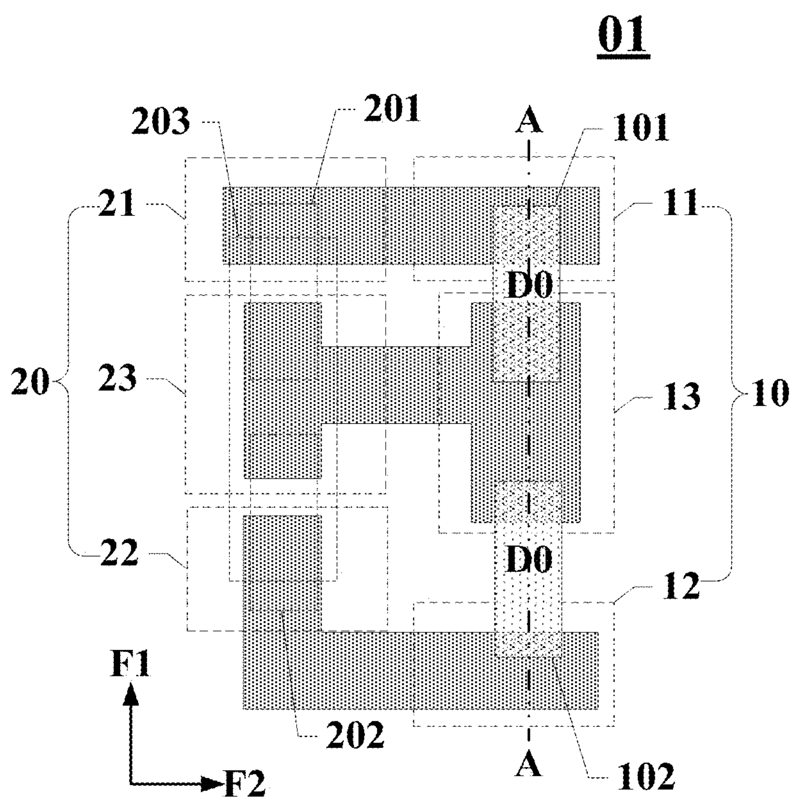
FIG. 3 is a schematic structural diagram in which a light-emitting device is introduced on an initial electrode pair according to an embodiment of the present disclosure.

FIG. 1 is a schematic structural diagram of a display panel according to an embodiment of the present disclosure, FIG. 2 is a schematic structural diagram of an electrode group 01 in the display panel, and FIG. 3 is a schematic structural diagram in which a light-emitting device D0 is introduced on an initial electrode pair. Reference is made to FIG. 1 to FIG. 3, a display panel 100 is provided according to an embodiment of the present disclosure. The display panel 100 includes: multiple electrode groups 01, the electrode groups

01 are configured to be electrically connected to the light-emitting device D0; each electrode group 01 includes an initial electrode 10 and a redundant electrode 20.

The initial electrode 10 includes a first electrode 11, an intermediate electrode 13, and a second electrode 12. A first initial electrode pair 101 is located between the first electrode 11 and the intermediate electrode 13, a second initial electrode pair 102 is located between the second electrode 12 and the intermediate electrode 13; in at least a part of the electrode groups 01, the first initial electrode pair 101 and the second initial electrode pair 102 are configured to connect to different light-emitting devices D0 respectively, one light-emitting device D0 connected to the first initial electrode pair 101 and another light-emitting device D0 connected to the second initial electrode pair 102 are connected in series.

The redundant electrode 20 includes a first redundant electrode 21, an intermediate redundant electrode 23 and a second redundant electrode 22. A first redundant electrode pair 201 is located between the first redundant electrode 21 and the intermediate redundant electrode 23, a second redundant electrode pair 202 is located between the second redundant electrode 22 and the intermediate redundant electrode 23; and/or, a third redundant electrode pair 203 is located between the first redundant electrode 21 and the second redundant electrode 22; in the same electrode group 01, the first redundant electrode 21 has the same electric potential as the first electrode 11, the intermediate redundant electrode 23 has the same electric potential as the intermediate electrode 13, and the second redundant electrode 22 has the same electric potential as the second electrode 12.

Figure 4:
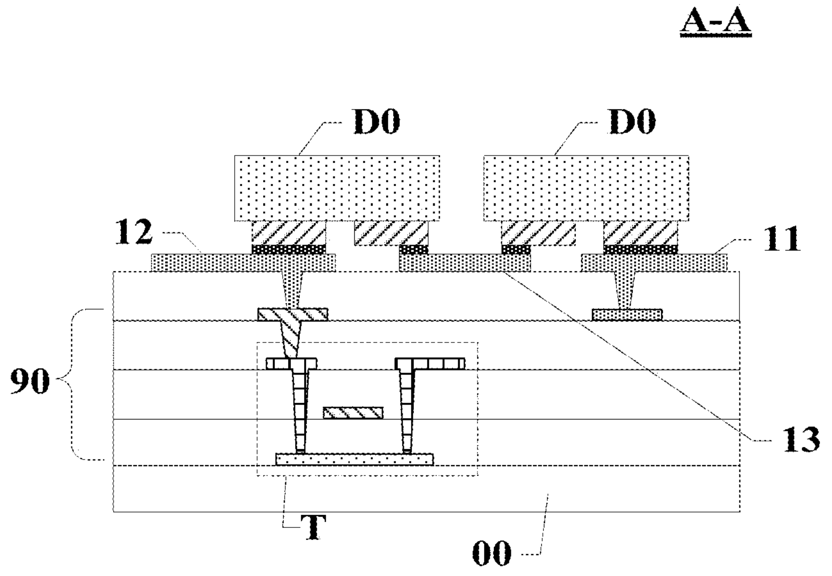
FIG. 4 is a cross-sectional view of the display panel corresponding to FIG. 3 in a direction indicated by AA.

It should be noted that the embodiment in FIG. 1 only shows a display panel with a rectangular structure, which does not limit the specific structure of the display panel of the present disclosure. In some other embodiments, the shape of the display panel may also be a rounded rectangle, a circle, an ellipse, or any other structure including curved edges, which is not limited by the present disclosure. FIG. 1 is only a schematic illustration of some of the electrode groups 01 in the display panel, and does not limit the number, shape and arrangement of the electrode groups 01 in the display panel. FIG. 2 only illustrates the structure of one electrode group 01 in the display panel, and the structure of other electrode groups 01 may be referred to in FIG. 2. It should be noted that FIG. 2 only illustrates one arrangement of the initial electrode 10 and the redundant electrode 20, and does not limit the actual structure and size of the electrodes. In one embodiment, the light-emitting device may be, for example, a Mini LED or a Micro LED, which is not limited herein. FIG. 4 is a cross-sectional view of the display panel corresponding to FIG. 3 in a direction indicated by AA. Reference is made to FIG. 2 and FIG. 4. In an embodiment, the display panel includes a substrate 00 and a driving layer 90 located on one side of the substrate 00, the electrode group 01 is located on one side of the driving layer 90 away from the substrate 00 and is electrically connected with the driving layer 90. In an embodiment, the electrodes in the electrode group 01 are configured for supporting and connecting the light-emitting device and transmitting an electrical signal to the light-emitting device. It should be noted that FIG. 4 only shows the first electrode 11, the intermediate electrode 13, and the second electrode 12 in the initial electrode 10 corresponding to the electrode group 01 and a connection relationship between these electrodes and the light-emitting devices. The connection of the redundant electrodes and the redundant light-emitting devices will be described in the subsequent embodiments.

Reference is made to FIG. 1 to FIG. 3. In one embodiment, the display panel includes multiple electrode groups 01, each electrode group 01 includes an initial electrode 10 and a redundant electrode 20, where the initial electrode 10 is configured for electrically connecting with the light-emitting device D0, and the redundant electrode 20 is configured for connecting a redundant light-emitting device when the light-emitting device D0 connected to the initial electrode 10 fails to emit light normally, and the redundant light-emitting device is configured to repair the light-emitting device D0 on the initial electrode 10. In the initial electrode 10, a first initial electrode pair 101 formed by the first electrode 11 and the intermediate electrode 13 is configured to connect a light-emitting device D0, and a second initial electrode pair 102 formed by the second electrode 12 and the intermediate electrode 13 is configured to connect another light-emitting device D0, and the two light-emitting devices D0 corresponding to the initial electrode 10 are connected in series.

Figure 5:
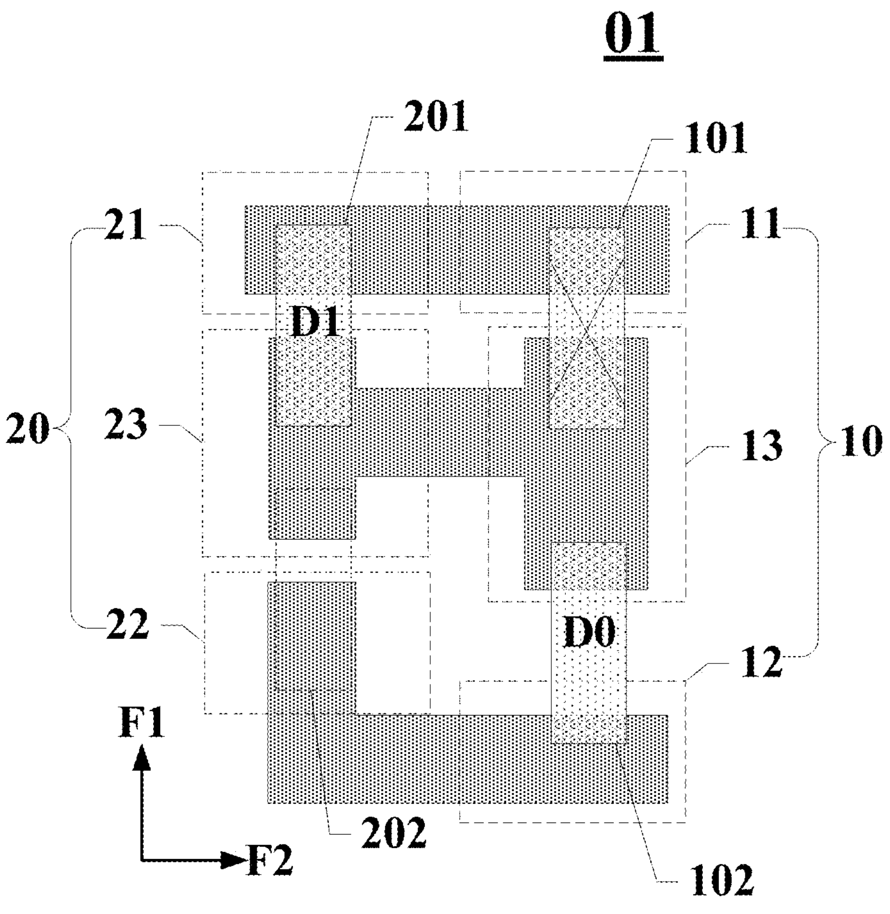
FIG. 5 is a diagram of a relative position relationship between the electrode pairs and the light-emitting device and the redundant light-emitting device in the electrode group according to an embodiment of the present disclosure.
Figure 6:
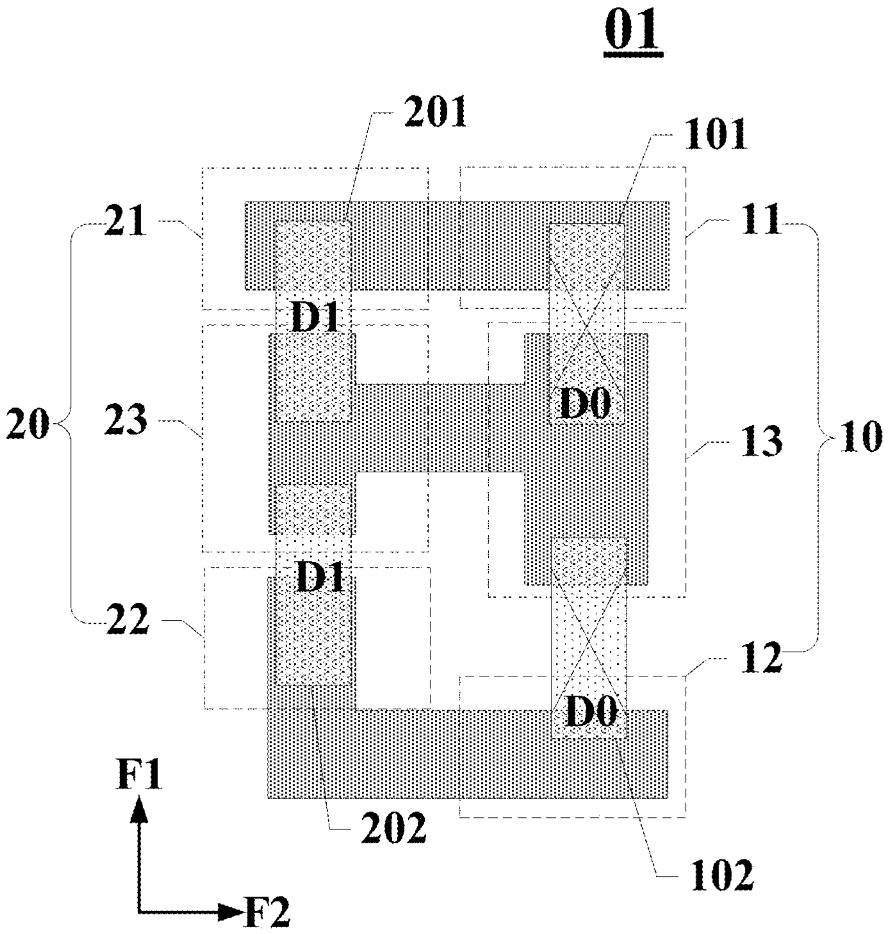
FIG. 6 is a diagram of a relative position relationship between the electrode pairs and the light-emitting device and the redundant light-emitting device in the electrode group according to another embodiment of the present disclosure.
Figure 7:
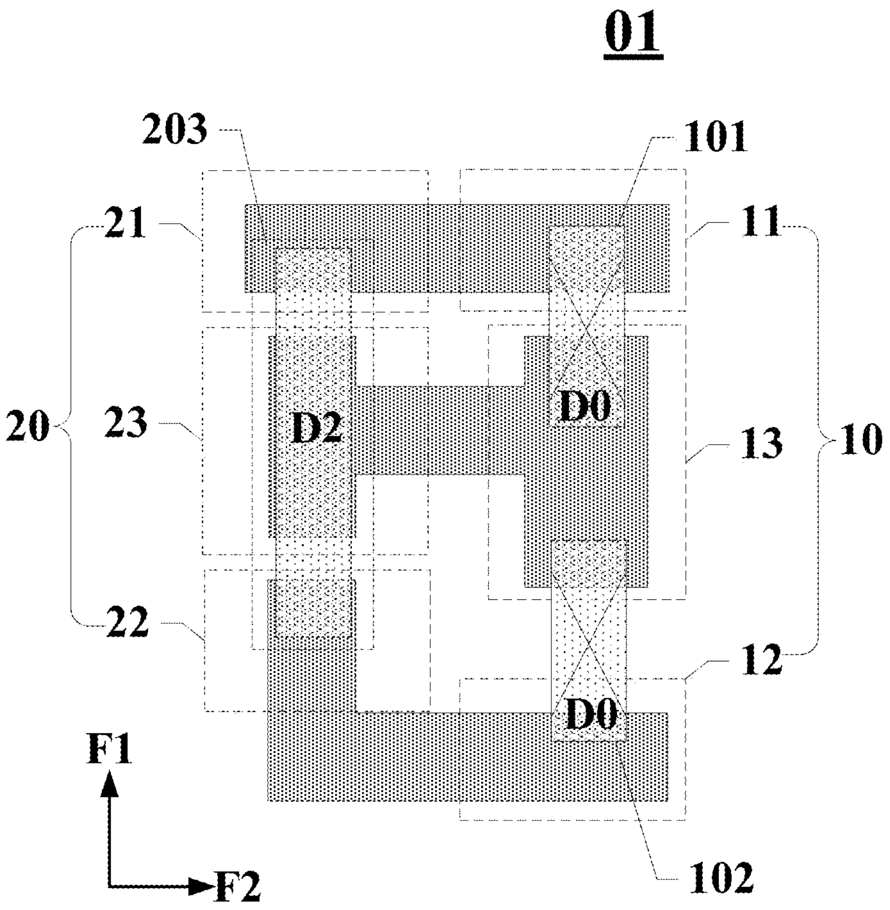
FIG. 7 is a diagram of a relative position relationship between the electrode pairs and the light-emitting device and the redundant light-emitting device in the electrode group according to another embodiment of the present disclosure.

A redundant electrode 20 is introduced in the embodiment of the present disclosure. A first redundant electrode pair 201 is located between the first redundant electrode 21 and the intermediate redundant electrode 23 in the redundant electrode 20, and a second redundant electrode pair 202 is located between a second redundant electrode 22 and an intermediate redundant electrode 23. Reference is made to FIG. 3 and FIG. 5. When the light-emitting device D0 of one initial electrode pair in the same electrode group 01 fails to emit light normally, a first redundant light-emitting device D1 may be introduced on the first redundant electrode pair 201 or the second redundant electrode pair 202, and the first redundant light-emitting device D1 is configured to replace the light-emitting device D0 in the initial electrode pair to emit light. FIG. 5 is a diagram of a relative position relationship of the electrode pairs and the light-emitting device D0 and the redundant light-emitting device in the electrode group. When the light-emitting devices D0 on the two initial electrode pairs in the same electrode group 01 do not emit light, for example, as shown in FIG. 6, two first redundant light-emitting devices D1 may be introduced into the electrode group 01 and are connected to the first redundant electrode pair 201 and the second redundant electrode pair 202 respectively. The two first redundant light-emitting devices D1 are configured to replace the two light-emitting devices D0 which fail to emit light normally, and the two first redundant light-emitting devices D1 are connected in series. FIG. 6 is a diagram of a relative position relationship of the electrode pairs and the light-emitting device and the redundant light-emitting device in the electrode group. In an embodiment, in the electrode group 01, a third redundant electrode pair 203 is located between the first redundant electrode 21 and the second redundant electrode 22. Reference is made to FIG. 7, when the light-emitting devices D0 on the two initial electrode pairs in the same electrode group 01 do not emit light, a second redundant light-emitting device D2 with a larger size may be introduced to be connected to the third redundant electrode pair 203, and specifically the second redundant light-emitting device D2 is connected with the first redundant electrode 21 and the second redundant electrode 22 respectively, to configure the second redundant light-emitting device D2 with a larger size to replace the two light-emitting devices D0, which cannot emit light normally, to emit light. FIG. 7 is a diagram of a relative position relationship of the electrode pairs and the light-emitting device and the redundant light-emitting device in the electrode group. Thus, when one or two light-emitting devices D0 on the initial electrode pairs in the electrode group 01 cannot emit light normally, there are corresponding redundant electrode pairs to set corresponding redundant light-emitting devices, which can replace the light-emitting devices D0 that do not emit light normally to emit light. Therefore, equal-position repair of the light-emitting devices can be realized, which is conducive to enhancing the restoration effect of the display panel.

In the actual production of the display panel, the light-emitting device D0 may be transferred to the initial electrode pair of each electrode group 01 first, and the light-emitting device D0 is electrically connected to the corresponding initial electrode pair. During the light-emitting detection, in a case that the light-emitting device D0 corresponding to a certain electrode group 01 does not emit light, the redundant light-emitting device may be connected to the redundant electrode pair corresponding to the electrode group 01, and the redundant light-emitting device is configured to replace the failed light-emitting device D0. For different electrode groups 01, in a case that the two light-emitting devices D0 connected in series on the initial electrode pairs do not emit light. A method for repairing a part of electrode groups 01 may be implemented through introducing two first redundant light-emitting devices D1 electrically connected to the first redundant electrode pair 201 and the second redundant electrode pair 202 respectively. A method for repairing another part of electrode groups 01 may be implemented through introducing a second redundant light-emitting device D0 with a larger size, which is electrically connected to the third redundant electrode pair 203. During the actual method for repairing, two first redundant light-emitting devices D1 may be introduced or one second redundant light-emitting device D2 may be introduced according to the actual needs, which is not limited by the present disclosure.

Reference is made to FIG. 2 to FIG. 7, in an embodiment, in the same electrode group 01, the first redundant electrode 21 and the first electrode 11 are integrated, the intermediate redundant electrode 23 and the intermediate electrode 13 are integrated, and the second redundant electrode 22 and the second electrode 12 are integrated.

In the same electrode group 01, since the first redundant electrode 21 and the first electrode 11 have the same electric potential, there is no need to introduce different manufacturing processes for the first redundant electrode 21 and the first electrode 11 respectively when they are integrally formed, which is conducive to simplifying the manufacturing process of the display panel. Similarly, since the intermediate redundant electrode 23 and the intermediate electrode 13 have the same electric potential, and the second redundant electrode 22 and the second electrode 12 have the same electric potential, the manner of integrally forming the intermediate redundant electrode 23 and the intermediate electrode 13, and integrally forming the second redundant electrode 22 and the second electrode 12 is conducive to simplifying the overall manufacturing process of the display panel.

Reference is made to FIG. 2 to FIG. 7, in an embodiment, the first electrode 11, the first redundant electrode 21, the intermediate electrode 13, the intermediate redundant electrode 23, the second electrode 12 and the second redundant electrode 22 are manufactured in the same layer and by the same process.

When the redundant electrode 20 is introduced into the electrode group 01, the first redundant electrode 21, the intermediate redundant electrode 23, and the second redundant electrode 22 in the redundant electrode 20 are manufactured in the same layer and by the same process as the first electrode 11, the intermediate electrode 13, and the second electrode 12 in the initial electrode 10, and there is no need to introduce a separate manufacturing process for the redundant electrode 20, which is conducive to simplifying the overall manufacturing process of the display panel. In addition, the manner in which the initial electrode 10 and the redundant electrode 20 are located in the same layer eliminates the need to introduce a separate layer structure for the redundant electrode 20, and thus facilitates simplifying the overall layer structure of the display panel.

Figure 8:
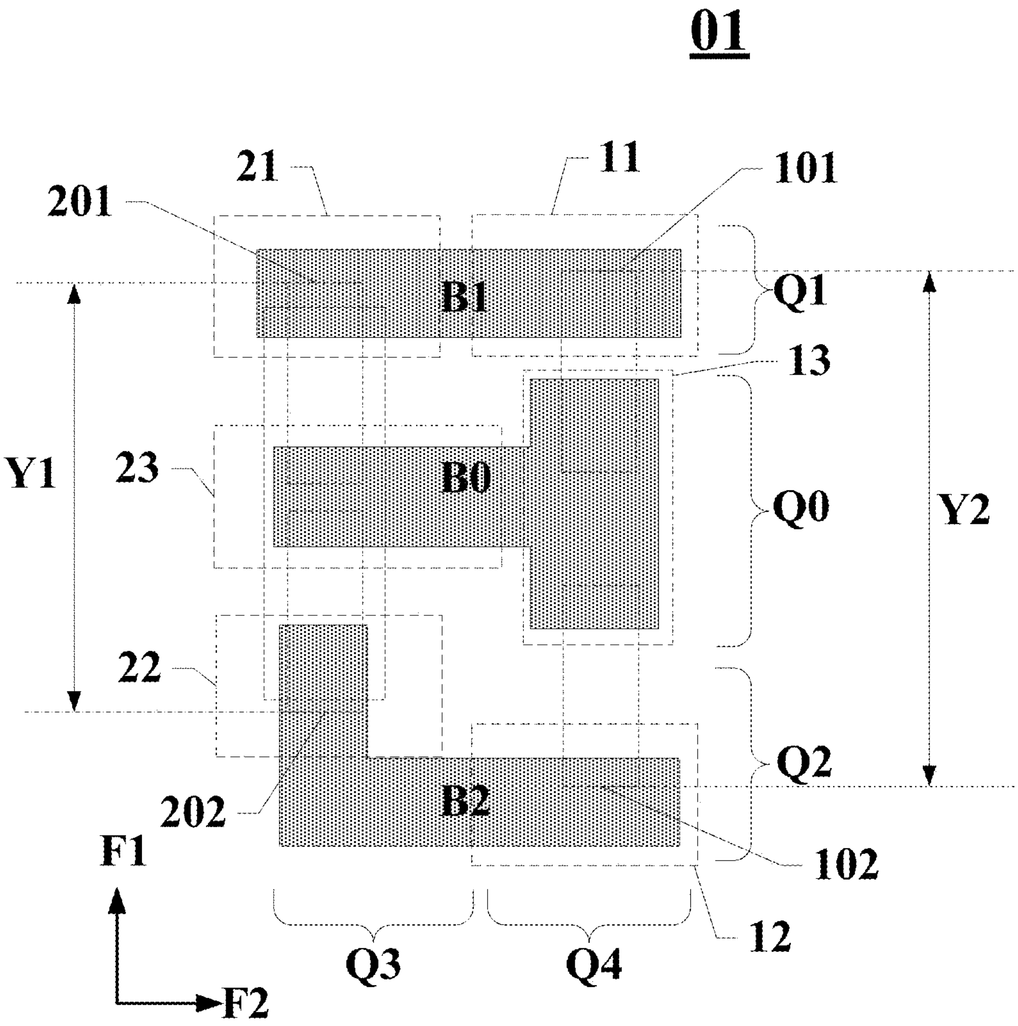
FIG. 8 is a schematic diagram of region division of an electrode group according to an embodiment of the present disclosure.

Reference is made to FIG. 8, which is a schematic diagram of region division of the electrode group herein. In one embodiment, the same electrode group 01 includes a first region Q1, an intermediate region Q0, and a second region Q2 arranged along a first direction F1, the intermediate region Q0 is located between the first region Q1 and the second region Q2. In the same electrode group 01, the first electrode 11 and the first redundant electrode 21 are located at least in the first region Q1, the intermediate electrode 13 and the intermediate redundant electrode 23 are located at least in the intermediate region Q0, and the second electrode 12 and the second redundant electrode 22 are located at least in the second region Q2.

In one embodiment, when the redundant electrode 20 is introduced into the electrode group 01, the first redundant electrode 21 in the redundant electrode 20 and the first electrode 11 in the initial electrode 10 are located in the first region Q1 of the electrode group 01, the intermediate redundant electrode 23 in the redundant electrode 20 and the intermediate electrode 13 in the initial electrode 10 are located in the intermediate region Q0 of the electrode group 01, and the second redundant electrode 22 in the redundant electrode 20 and the second electrode 12 in the initial electrode 10 are located in the second region Q2 of the electrode group 01, which is conducive to realizing a centralized arrangement of the redundant electrode 20 and the initial electrode 10 in the electrode group 01, therefore it is beneficial to reduce the space occupied by the redundant electrode 20 and the initial electrode in the electrode group 01 in the display panel, which is conducive to enhancing the space utilization of the display panel. When the display panel is a transparent display panel, the structure of the electrode group herein does not occupy the space of the transparent region, which is conducive to enhancing the transparency of the transparent display panel. 10

Reference is made to FIG. 8, in an embodiment, the electrode group 01 includes a first electrode portion B1 located in the first region Q1, an intermediate electrode portion B0 located in the intermediate region Q0, and a second electrode portion B2 located in the second region Q2. The first electrode portion B1 includes the first electrode 11 and the first redundant electrode 21, the intermediate electrode portion B0 includes the intermediate electrode 13 and the intermediate redundant electrode 23, and the second electrode portion B2 includes the second electrode 12 and the second redundant electrode 22. The electrode group 01 is divided into a third region Q3 and a fourth region Q4 arranged in a second direction F2, the first redundant electrode 21, the intermediate redundant electrode 23 and the second redundant electrode 20 are located in the third region Q3, the first electrode 11, the intermediate electrode 13 and the second electrode 12 are located in the fourth region Q4, the second direction F2 intersects with the first direction F1.

When the electrode group 01 is divided into a first region Q1, an intermediate region Q0, and a second region Q2 along the first direction F1. The first electrode portion B1, the intermediate electrode portion B0, and the second electrode portion B2 are located in the first region Q1, the intermediate region Q0, and the second region Q2 respectively, where the first electrode portion B1 includes a first redundant electrode 21 and a first electrode 11, that is, the first redundant electrode 21 and the first electrode 11 are integrated; the intermediate electrode portion B0 includes an intermediate redundant electrode 23 and an intermediate electrode 13, that is, the intermediate redundant electrode 23 and the intermediate electrode 13 are integrated; and the second electrode portion B2 includes the second redundant electrode 22 and the second electrode 12, that is, the second redundant electrode 22 and the second electrode 12 are integrated. On this basis, in this embodiment, the redundant electrode 20 is disposed as a whole in the third region of the electrode group 01, the initial electrode 10 is disposed as a whole in the fourth region Q4 of the electrode group 01. That is, the first redundant electrode 21, the intermediate redundant electrode 23, and the second redundant electrode 22 are centrally arranged in the third region Q3. The first electrode 11, the intermediate electrode 13, and the second electrode 12 are centrally arranged in the fourth region Q4. The third region Q3 and the fourth region Q4 are arranged along the second direction F2, and the light-emitting device D0 is centrally arranged in the fourth region Q4 of each electrode group 01. When transferring the light-emitting devices D0 to the initial electrode pairs of the display panel through mass transfer method in the process of manufacturing the display panel, the light-emitting devices D0 are uniformly transferred to the fourth region Q4 of the electrode group 01, which is conducive to simplifying the difficulty of transferring the light-emitting devices D0 to the initial electrode pair. In an embodiment, in the same electrode group, the intermediate electrode portion B0 of the initial electrode and the redundant electrode are shared, which may satisfy the space requirement for the light-emitting devices, which are connected in series, on the initial electrode pair, which may satisfy the space requirement for introducing the light-emitting device to the redundant electrode pair for equal-position repair, which is conducive to enhancing the space utilization of the display panel.

Reference is made to FIG. 2. In an embodiment, in the same electrode group 01, a direction of the initial electrode is the same as an extension of the redundant electrode pair. In one embodiment, Reference is made to FIG. 9, which is another schematic structural diagram of the electrode group 01 in the display panel. In an embodiment, in the same electrode group 01, the direction of the initial electrode is different from the direction of the redundant electrode.

In an embodiment, the initial electrode pair includes a first initial electrode pair 101 and a second initial electrode pair 102. The direction of the initial electrode may be regarded as an arrangement direction of the first electrode 11 and the intermediate electrode 13 in the initial electrode 10, or an arrangement direction of the second electrode 12 and the intermediate electrode 13, or an arrangement direction of two electrodes in the light-emitting device (For example, N-pole and P-pole of the light-emitting device) corresponding to the initial electrode pair. Or, the direction of the initial electrode may be regarded as a direction points from a connection point between the first electrode and the light-emitting device to a connection point between the intermediate electrode and the light-emitting device, or a direction points from a connection point between the intermediate electrode and the light-emitting device to a connection point between the second electrode and the light-emitting device. In the same electrode group 01, the arrangement direction of the first electrode 11 and the intermediate electrode 13 is the same as the arrangement direction of the second electrode 12 and the intermediate electrode 13, and the transfer of the light-emitting devices D0 corresponding to the initial electrode pairs can be completed by one transfer. The direction of the redundant electrode may be regarded as an arrangement direction of the first redundant electrode 21 and the intermediate redundant electrode 23, or an arrangement direction of the second redundant electrode 22 and the intermediate redundant electrode 23 in the redundant electrode 20, or an arrangement direction of the two electrodes (For example, the N-pole and the P-pole of the light-emitting device) in a redundant light-emitting device corresponding to the redundant electrode pair. In the same electrode group 01, the arrangement direction of the first redundant electrode 21 and the intermediate redundant electrode 23 is the same as and the arrangement direction of the second redundant electrode 22 and the intermediate redundant electrode 23.

When a redundant electrode pair is introduced into the electrode group 01, the direction of the redundant electrode may be the same as the direction of the initial electrode. Reference is made to FIG. 2, the direction of the redundant electrode and the direction of the initial electrode are both the first direction F1. In such way, when a redundant light-emitting device is introduced at the redundant electrode pair, the extension direction of the redundant light-emitting device is the same as the extension direction of the light-emitting device that does not emit light normally on the initial electrode pair, thus the redundant light-emitting device may better replace the light-emitting device on the initial electrode pair to emit light. In one embodiment, when the direction of the redundant electrode is the same as the direction of the initial electrode, in the same electrode group 01, the first redundant electrode 21, the intermediate redundant electrode 23, and the second redundant electrode 22 are arranged in the first direction F1, and the first redundant electrode pair 201 and the second redundant electrode pair 202 are also arranged in the first direction F1; the first electrode 11, the intermediate electrode 13, and the second electrode 12 are arranged in the first direction F1, the first electrode pair 101 and the second electrode pair 102 are also arranged in the first direction F1. When the direction of the redundant electrode is the same as the direction of the initial electrode, and a redundant light-emitting device is introduced into the redundant electrode pair to replace the failed light-emitting device at the initial electrode pair to emit light, the extension direction of the redundant light-emitting device is the same as the extension direction of the failed light-emitting device, which can weaken the visual difference when the redundant light-emitting device replace the failed light-emitting device.

Figure 9:
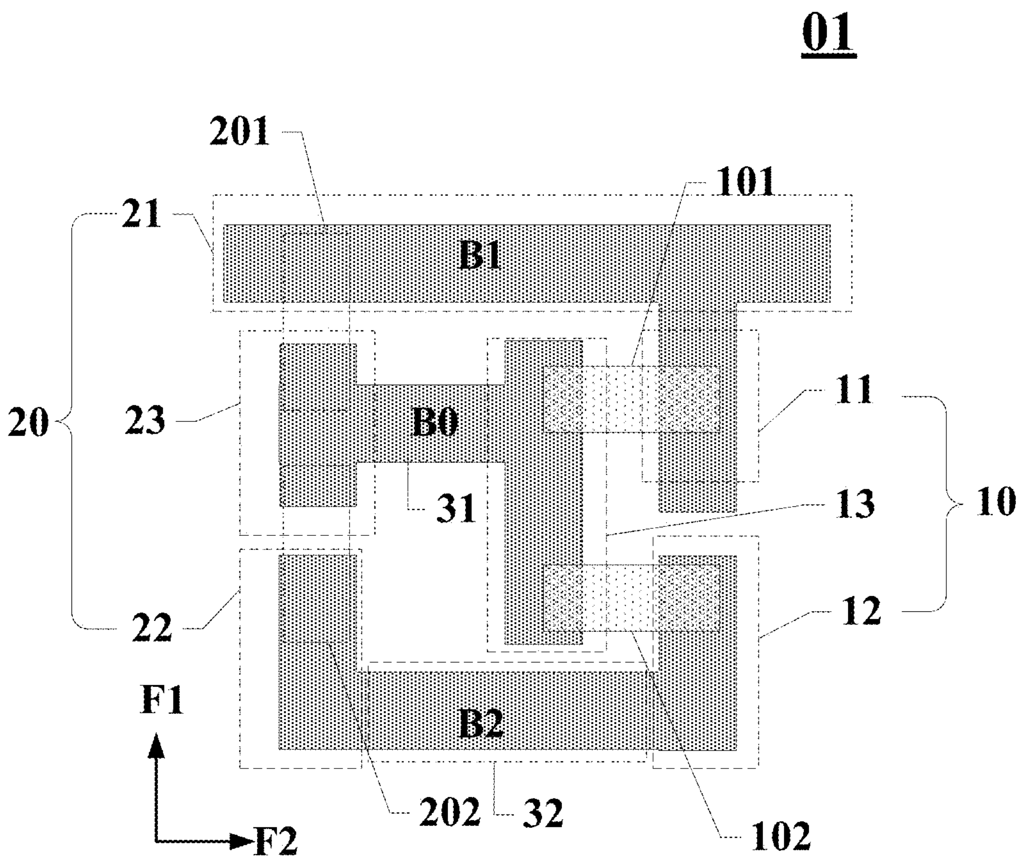
FIG. 9 is a schematic structural diagram of an electrode group in the display panel according to another embodiment of the present disclosure.

Reference is made to FIG. 9, in some other embodiments, when the redundant electrode pair is introduced into the electrode group 01, the direction of the redundant electrode may be different from the direction of the initial electrode, the direction of the redundant electrode is the first direction F1 and the direction of the initial electrode is the second direction F2, to satisfy different arrangement requirements of the redundant electrode 20 and the initial electrode 10, and realize a diversified design of the structure of the electrode group 01.

When the direction of the redundant electrode is different from the direction of the initial electrode, referring to FIG. 9, in an embodiment, in the same electrode group 01, the relative position relationship of the first redundant electrode 21, the intermediate redundant electrode 23, the second redundant electrode 22, the first electrode 11, the intermediate electrode 13, and the second electrode 12 is: the first redundant electrode 21, the intermediate redundant electrode 23, and the second redundant electrode 22 are arranged in the first direction F1, and the first redundant electrode pair 201 and the second redundant electrode pair 202 are arranged in the first direction F1. In such way, when a redundant light-emitting device is located on the first redundant electrode pair 201 and/or the second redundant electrode pair 202, the redundant light-emitting device extends in the first direction F1. The first electrode 11 and the intermediate electrode 13 are arranged in the second direction F2. The second electrode 12 and the intermediate electrode 13 are arranged in the second direction F2, and the first electrode pair 101 and the second electrode pair 102 are arranged in the first direction F1, and the extension directions of the light-emitting devices D0 on the first electrode pair 101 and the second electrode pair 102 are both the second direction F2, and the two light-emitting devices D0 connected in series are arranged along the first direction F1. The direction of the redundant electrode is different from the direction of the initial electrode, which is conducive to realizing the structural diversification of the electrode group 01.

Reference is made to FIG. 8, in an embodiment, the intermediate electrode portion B0 is in a T-shaped structure, the intermediate electrode 13 extends along the first direction F1, and the intermediate redundant electrode 23 extends along the second direction F2.

In the electrode group 01, the intermediate electrode portion B0 is arranged between the first electrode portion B1 and the second electrode portion B2 along the first direction F1, the intermediate electrode portion B0 includes the intermediate redundant electrode 23 and the intermediate electrode 13. When the intermediate electrode portion B0 is the T-shape structure, the extension direction of the intermediate redundant electrode 23 is different from the extension direction of the intermediate electrode 13, where the intermediate redundant electrode 23 extends along the second direction F2, and the intermediate electrode 13 extends along the first direction F1. When the intermediate electrode 13 extends along the first direction F1, it is beneficial to increase a size of the intermediate electrode 13 along the first direction F1, and a portion of the intermediate electrode 13 facing the first electrode 11 forms the first electrode pair 101 with the first electrode 11, and another portion of the intermediate electrode 13 facing the second electrode 12 forms the second electrode pair 102 with the second electrode 12, and the first electrode pair 101 and the second electrode pair 102 meet the binding position requirements of the two light-emitting devices D0 connected in series, which is conducive to reducing the difficulty of binding the light-emitting devices D0 to the first electrode pair 101 and the second electrode pair 102 respectively.

Reference is made to FIG. 9, in an embodiment, the intermediate electrode portion B0 is an I-shape structure, the intermediate electrode 13 and the intermediate redundant electrode 23 both extend along the first direction F1, and the intermediate electrode 13 and the intermediate redundant electrode 23 are connected by the first connection portion 31 extending along the second direction F2.

The embodiment of the present disclosure illustrates another structure of the intermediate electrode 13 in the electrode group 01. In one embodiment, the intermediate electrode portion B0 is an I-shape structure, the intermediate redundant electrode 23 and the intermediate electrode 13 in the intermediate electrode portion B0 both extend along the first direction F1, and the intermediate redundant electrode 23 and the intermediate electrode 13 are connected by the first connection portion 31, the first connection portion 31 extends along the second direction F2. With respect to the first connection portion 31, the intermediate electrode 13 extends along the first direction F1 toward the first electrode 11 and the second electrode 12 respectively, and the intermediate redundant electrode 23 extends along the first direction F1 toward the first redundant electrode 21 and the second redundant electrode 22 respectively. The portion of the intermediate electrode 13 extending toward the first electrode 11 and the first electrode 11 form the first initial electrode pair 101, and the portion of the intermediate electrode 13 extending toward the second electrode 12 and the second electrode 12 form the second initial electrode pair 102. The manner, in which the intermediate electrode 13 extends toward two sides along the first direction F1 respectively, is capable of providing a larger binding space for the light-emitting device D0, thereby it is beneficial to simplify the difficulty of binding the light-emitting device D0 corresponding to the first initial electrode pair 101 and the second initial electrode pair 102. Similarly, the portion of the intermediate redundant electrode 23 extending toward the first redundant electrode 21 forms the first redundant electrode pair 201 with the first redundant electrode 21, the portion of the intermediate redundant electrode 23 extending toward the second redundant electrode 22 forms the second redundant electrode pair 202 with the second redundant electrode 22. The manner, in which the intermediate redundant electrode 23 extends toward both sides along the first direction F1 respectively, is capable of providing a larger binding space for the redundant light-emitting device, thereby it is beneficial to simplify the difficulty of binding the redundant light-emitting device corresponding to the first redundant electrode pair 201 and the second redundant electrode pair 202.

In an embodiment, referring to FIG. 2, in the first electrode portion B1 of the same electrode group 01, the first electrode 11 and the first redundant electrode 21 extend in the second direction F2 as a whole. In one embodiment, referring to FIG. 9, the first redundant electrode 21 extends in the second direction F2, the first electrode 11 extends in the first direction F1, and the first electrode 11 is located on one side of the first redundant electrode 21 facing the second electrode portion B2.

FIG. 2 and FIG. 9 schematically illustrate two feasible structures of the first electrode portion B1 in the electrode group 01 respectively. As shown in FIG. 2, one feasible structure of the first electrode portion B1 is a long strip structure extending along the second direction F2, and such a structure of the first electrode portion B1 is relatively simple and easy to manufacture. When the first electrode portion B1 is a long strip extending along the second direction F2, it is applicable to the solution that the direction of the redundant electrode is the same as the direction of the initial electrode in the electrode group 01. Reference is made to FIG. 9, the first electrode portion B1 is in a T-shaped structure, the first redundant electrode 21 in the first electrode portion B1 extends along the second direction F2, and the first electrode 11 is connected to the first redundant electrode 21 and extends toward the second electrode portion B2 in first direction F1. The intermediate electrode 13 may also extend along the first direction F1, and the intermediate electrode 13 and the first electrode 11 are arranged along the second direction F2, and the extension of the first electrode pair 101 formed by the first electrode 11 and the intermediate electrode 13 is the second direction F2, and the space of the electrode group 01 along the second direction F2 can be reasonably utilized while meeting the requirement for setting electrode pairs in different directions.

Reference is made to FIG. 2, in an embodiment, in the second electrode portion B2 of the same electrode group 01, the second electrode 12 extends along the second direction F2, the second redundant electrode 22 extends along the first direction F1, and the second redundant electrode pair 202 is on one side of the second electrode 12 facing the first electrode portion B1.

In one embodiment, a feasible structure of the second electrode portion B2 is illustrated. In one embodiment, the second electrode portion B2 is an L-shaped structure, the second electrode 12 in the second electrode portion B2 extends along a second direction F2, the second redundant electrode 22 is connected to the second electrode 12 and extends along the first direction F1 toward the intermediate redundant electrode 23. The manner of the second redundant electrode 22 extending toward the intermediate redundant electrode 23 is conductive to reducing a distance between the second redundant electrode 22 and the intermediate redundant electrode 23, to satisfy the size requirement of the second redundant electrode pair formed by the second redundant electrode 22 and the intermediate redundant electrode 23. Meanwhile, when the second redundant electrode 22 extends toward the intermediate redundant electrode 23, the size of the second redundant electrode 22 along the first direction F1 is increased, to facilitate the increase of the binding space when binding the redundant light-emitting device to the second redundant electrode 22, and thus facilitating the reduction of the binding difficulty.

Figure 10:
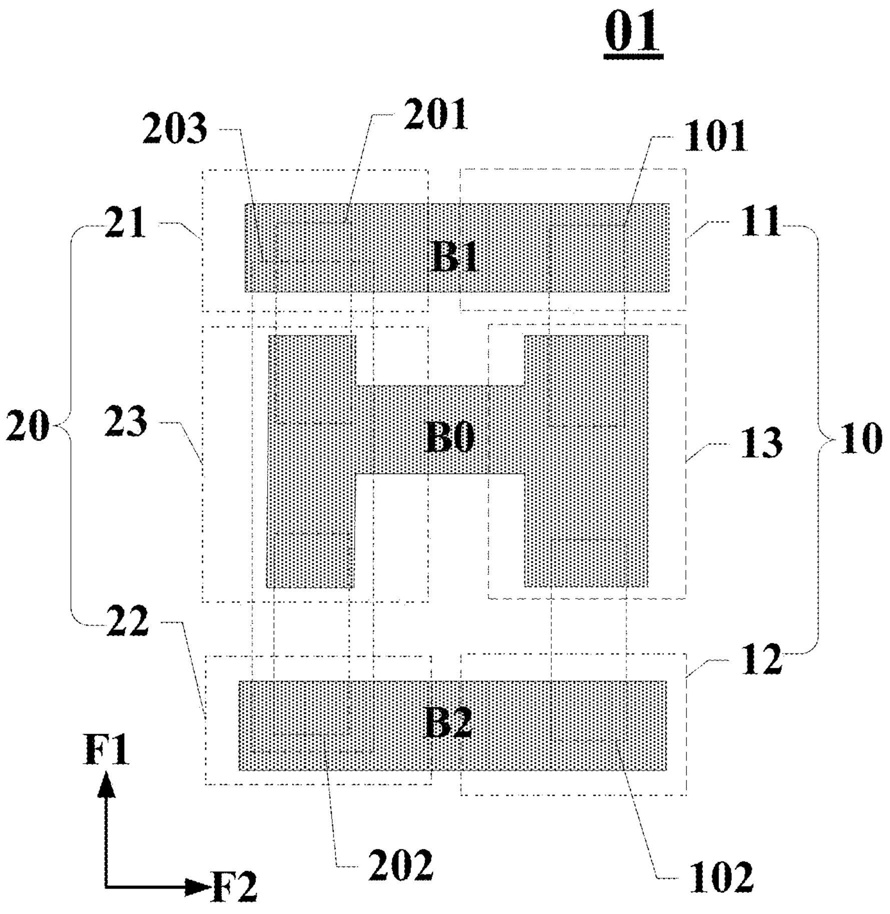
FIG. 10 is a schematic structural diagram of an electrode group in the display panel according to another embodiment of the present disclosure.

In some other embodiments, the second electrode portion B2 may also be configured as a strip-like structure extending along the second direction F2. Reference is made to FIG. 10, which is another schematic structural diagram of the electrode group 01 in the display panel. The second electrode 12 and the second redundant electrode 22 are in a strip-like structure as a whole, which is conducive to simplifying the manufacturing process. When the second electrode portion B2 is configured as a strip-like structure extending along the second direction F2, the size of the second electrode pair 102 formed by the second redundant electrode 22 and the intermediate redundant electrode 23 should meet the binding requirements of the redundant light-emitting device.

Reference is made to FIG. 9, in an embodiment, in the second electrode portion B2 of the same electrode group 01, both the second electrode 12 and the second redundant electrode 22 extend along the first direction F1, the second electrode 12 and the second redundant electrode 22 are connected by the second connection portion 32 extending along the second direction F2, the second electrode 12 and the second redundant electrode 22 are located at least on side of the second connection portion 32 facing the first electrode portion B1.

In an embodiment, another feasible structure of the second electrode portion B2 is illustrated. In one embodiment, the second electrode portion B2 is a concave structure, where the second electrode 12 and the second redundant electrode 22 in the second electrode portion B2 both extend toward one side of the first connection portion 31 along the first direction F1. The second electrode 12 and the second redundant electrode 22 are connected by the second connection portion 32 extending along the second direction F2. This structure is particularly suitable for the situation that the direction of the initial electrode is the second direction F2. The manner, in which the second electrode 12 and the second redundant electrode 22 extend toward the first electrode portion B1, increases sizes of the second electrode 12 and the second redundant electrode 22 along the first direction F1, to facilitate the increase of the binding area between the light-emitting device D0 and the second electrode 12, facilitating the increase of the binding area between the redundant light-emitting device and the second redundant electrode 22, which is beneficial to reduce the difficulty of binding the light-emitting device D0 and the redundant light-emitting device.

Figure 11:
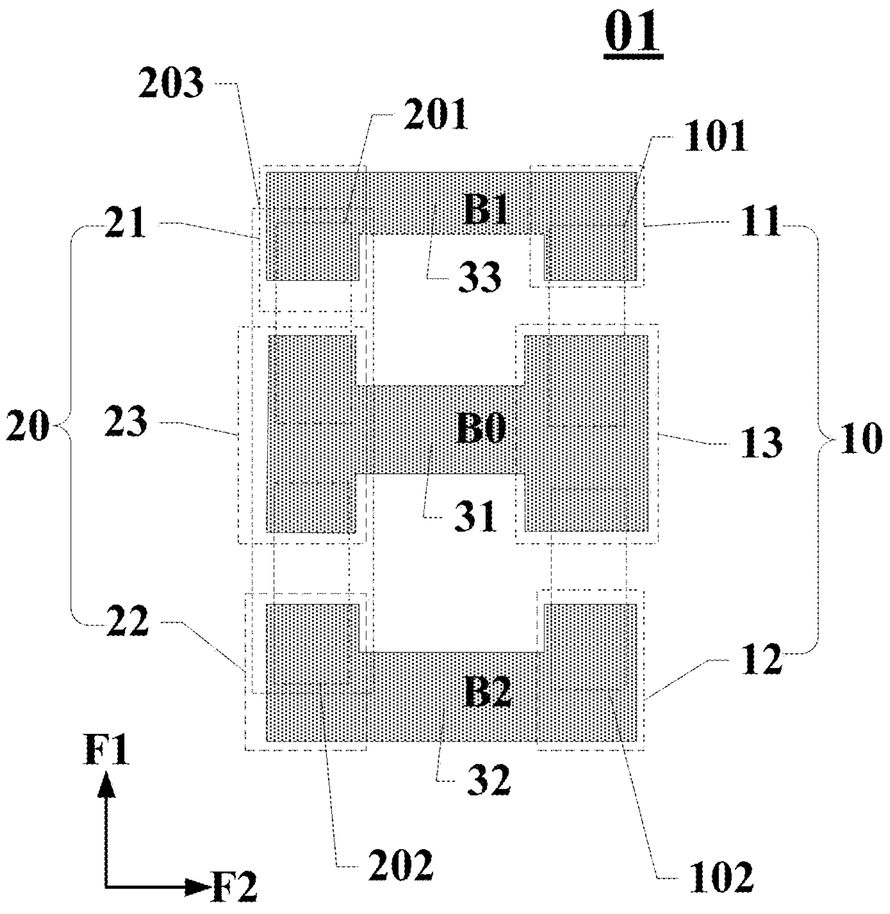
FIG. 11 is a schematic structural diagram of an electrode group in the display panel according to another embodiment of the present disclosure.

FIG. 11 is another schematic structural diagram of the electrode group 01 in the display panel. Reference is made to FIG. 11, in an embodiment, in the same electrode group 01, the intermediate electrode 13 and the intermediate redundant electrode 23 are connected by a first connection portion 31, the second electrode 12 and the second redundant electrode 22 are connected by a second connection portion 32, the first electrode 11 and the first redundant electrode 21 are connected by a third connection portion 33. The first connection portion 31, the second connection portion 32 and the third connection portion 33 are parallel.

In an embodiment, another feasible structure of the electrode group 01 is illustrated. A first connection portion 31 is introduced between the intermediate electrode 13 and the intermediate redundant electrode 23 in the intermediate electrode portion B0, a second connection portion 32 is introduced between the second electrode 12 and the second redundant electrode 22 in the second electrode portion B2, and a third connection portion 33 is introduced between the first electrode 11 and the first redundant electrode 21 in the first electrode portion B1. The first connection portion 31, the second connection portion 32 and the third connection portion 33 all extend along the second direction F2, that is, the first connection portion 31, the second connection portion 32 and the third connection portion 33 are parallel. It is advantageous to simplify the arrangement structure of the electrode group 01 when the first connection portion 31, the second connection portion 32 and the third connection portion 33 are arranged in parallel.

Reference is made to FIG. 11, in one embodiment, the first electrode 11 and the first redundant electrode 21 may be configured as a raised structure extending toward the second electrode portion B2, the intermediate electrode 13 and the intermediate redundant electrode 23 may be configured as a raised structure extending toward the first electrode portion B1 and the second electrode portion B2 respectively, the second electrode 12 and the second redundant electrode 22 may be configured as a raised structure extending toward the first electrode portion B1, which is conductive to increasing the binding area between the light-emitting device D0, the redundant light-emitting device and the electrode group 01, and reducing the difficulty of binding the light-emitting device D0, the redundant light-emitting device and the electrode group 01, and increasing the reliability of the electrical connection between the light-emitting device D0, the redundant light-emitting device and the electrode group 01.

Figure 12:
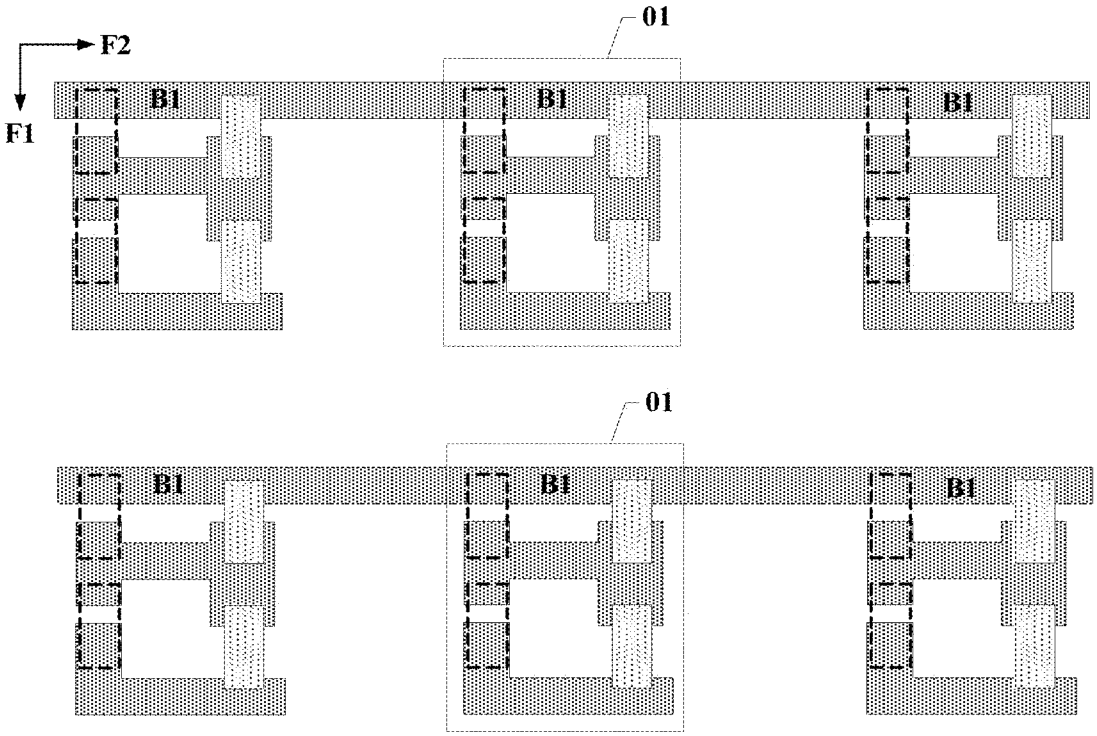
FIG. 12 is a schematic diagram of an arrangement of multiple electrode groups according to an embodiment of the present disclosure.

FIG. 12 is a schematic diagram of an arrangement of multiple electrode groups. Reference is made to FIG. 12, in an embodiment, the multiple electrode groups 01 are arranged in an array along the first direction F1 and the second direction F2, and the first electrode portions B1 in the multiple electrode groups 01 located in the same row along the second direction F2 are shared.

Reference is made to FIG. 12, in one embodiment, multiple electrode groups 01 are illustrated through an example of three electrode groups 01 arranged along the second direction F2. In one embodiment, when multiple electrode groups 01 are arranged in the same row along the second direction F2, the first electrode portion B1 in the multiple electrode groups 01 located in the same row may be shared, that is, the first electrode portion B1 of the multiple electrode groups 01 located in the same row is integrated. In such way, there is no need to separately provide different first electrode portions B1 for different electrode groups 01 disposed in the same row, and there is no need to separately provide electrical signals for the first electrode portions B1 in different electrodes disposed in the same row, to facilitate simplifying the manufacturing process of the electrode groups 01 and the signal transmission structure in the display panel.

Figure 13:
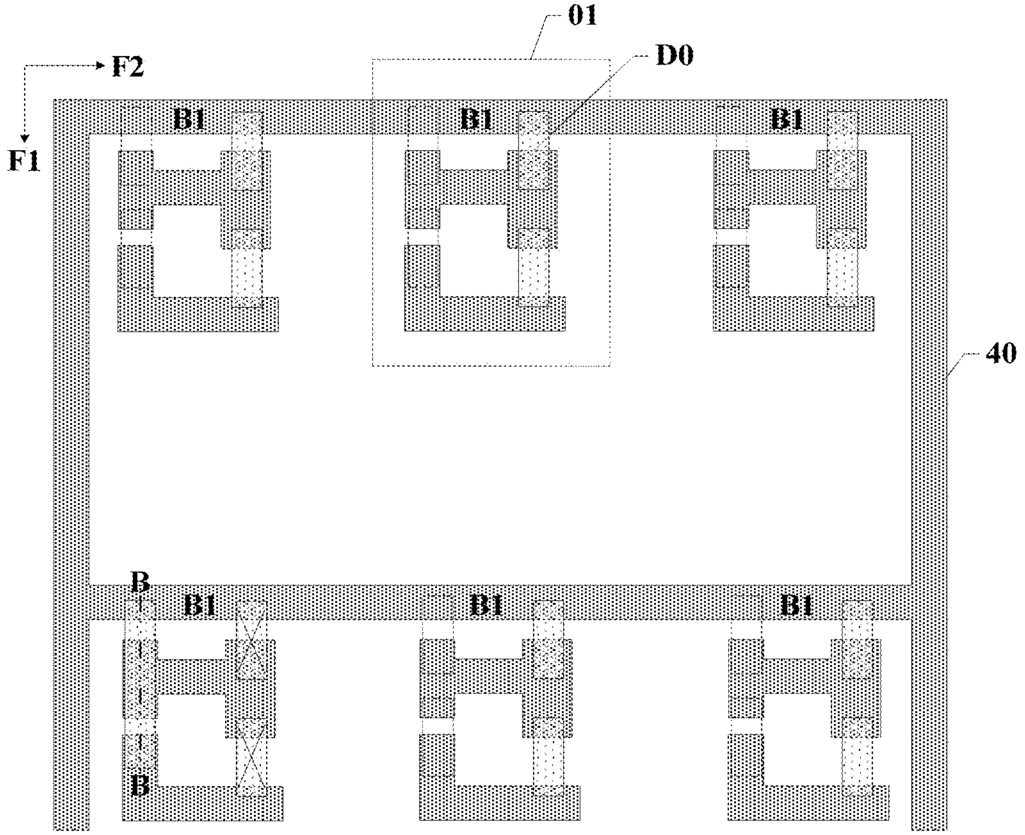
FIG. 13 is a schematic diagram of an arrangement of multiple electrode groups according to another embodiment of the present disclosure.

FIG. 13 is another schematic diagram of an arrangement of multiple electrode groups 01. Referring to FIG. 13, in an embodiment, the display panel further includes a connection portion 40 extending along the first direction F1, multiple first electrode portions B1 arranged along the first direction F1 are electrically connected through at least one connection portion 40.

Reference is made to FIG. 13, in one embodiment, an arrangement and connection relationship between multiple electrode groups 01 arranged in an array along the first direction F1 and the second direction F2 is illustrated. In one embodiment, the first electrode portions B1 corresponding to the electrode groups 01 in different rows are connected to each other and are connected by the connection portion 40 extending along the first direction F1, and the first electrode portions B1 corresponding to different electrode groups 01 are connected to each other. In practice, the same signal terminal may be configured to provide electrical signals to the first electrode portions B1 corresponding to the different electrode groups 01, which is beneficial to simplify the design of the driving chip that provides electrical signals to the first electrode portions B1.

In one embodiment, in order to improve the consistency of the signals on the first electrode portions B1 corresponding to the electrode groups 01 at different positions, two or more connection portions 40 may be introduced to realize the connection between different first electrode portions B1. FIG. 13 illustrates a solution of introducing two connection portions 40. In some other embodiments, three or more connection portions 40 may be introduced to the display panel, which is not specifically limited herein. In one embodiment, when two connection portions 40 are introduced, the two connection portions 40 may be located on both sides of the first electrode portion B1 along the second direction F2 respectively.

Reference is made to FIG. 13, in an embodiment, the connection portion 40 and the first electrode portion B1 are manufactured in the same layer and by the same process, and there is no need to introduce different manufacturing processes and materials for different first electrode portions B1 and connection portions 40, which is conducive to simplifying the manufacturing process of the electrode group 01 in the display panel and enhancing the manufacturing efficiency of the display panel.

Reference is made to FIG. 8. In an embodiment, in the same electrode group 01 along the first direction F1, a total size Y1 of the first redundant electrode pair 201 and the second redundant electrode pair 202 is less than or equal to a total size Y2 of the first initial electrode pair 101 and the second initial electrode pair 102.

The total size Y1 of the first redundant electrode pair 201 and the second redundant electrode pair 202 may be regarded as a distance between an edge of the first redundant electrode pair 201 away from the second redundant electrode pair 202 along the first direction F1 and an edge of the second redundant electrode pair 202 away from the first redundant electrode pair 201 along the first direction F1. The total size Y2 of the first initial electrode pair 101 and the second initial electrode pair 102 may be regarded as a distance between an edge of the first initial electrode pair 101 away from the second initial electrode pair 102 along the first direction F1 and an edge of the second initial electrode pair 102 away from the first initial electrode pair 101 along the first direction F1. Reference is made to FIG. 3, the edge of the first initial electrode pair 101 away from the second initial electrode pair 102 along the first direction F1 may be regarded as an edge of the light-emitting device D0 bound to the first initial electrode pair 101 away from the second initial electrode pair 102 along the first direction F1 in the orthographic projection of the light-emitting surface of the display panel. Similarly, the edge of the second initial electrode pair 102 away from the first initial electrode pair 101 along the first direction F1 may be regarded as an edge of the light-emitting device D0 bound to the second initial electrode pair 102 away from the first initial electrode pair 101 along the first direction F1 in the orthographic projection of the light-emitting surface of the display panel. Reference is made to FIG. 6, the edge of the first redundant electrode pair 201 away from the second redundant electrode pair 202 along the first direction F1 may be regarded as the edge of the light-emitting device D1 bound to the first redundant electrode pair 201 away from the second redundant electrode pair 202 along the first direction F1 in the orthographic projection of the light-emitting surface of the display panel. Similarly, the edge of the second redundant electrode pair 202 away from the first redundant electrode pair 201 along the first direction F1 may be regarded as the edge of the light-emitting device D1 bound to the second redundant electrode pair 202 away from the first redundant electrode pair 201 along the first direction F1 in the orthographic projection of the light-emitting surface of the display panel.

In an embodiment, after the redundant electrode 20 is introduced into the electrode group 01, the space occupied by the redundant electrode pair along the first direction F1 does not exceed the space occupied by the original initial electrode pair along the first direction F1. That is, the total size of the first redundant electrode pair 201 and the second redundant electrode pair 202 along the first direction F1 (which may also be regarded as the size of the third redundant electrode pair 203 along the first direction F1) is less than or equal to the total size of the first initial electrode pair 101 and the second initial electrode pair 102 along the first direction F1. In an embodiment, in the same electrode group 01, the upper edge of the redundant electrode pair does not exceed the upper edge of the initial electrode pair along the first direction F1, and the lower edge of the redundant electrode pair does not exceed the lower edge of the initial electrode pair along the first direction F1. In this manner, after the redundant electrode 20 is introduced into the electrode group 01, the size of the electrode group 01 along the first direction F1 is not increased, which is conducive to enhancing the overall space utilization of the display panel. In addition, when a light-emitting device on the initial electrode pair fails and a redundant light-emitting device is introduced on the redundant electrode pair to replace the light-emitting device that fails, the total size of the first redundant electrode pair 201 and the second redundant electrode pair 202 along the first direction F1 is less than or equal to the total size of the first initial electrode pair 101 and the second initial electrode pair 102 along the first direction F1, and the distance between the redundant light-emitting device and a not-failed light-emitting device on the initial electrode pair is closer to the distance between the failed light-emitting device and the not-failed light-emitting device on the initial electrode pair, which is conducive to weakening the difference in the arrangement structure of the light-emitting device capable of emitting light corresponding to different electrode groups, and thus facilitating weakening the visual difference.

Reference is made to FIG. 5 or FIG. 6, in an embodiment, in at least one electrode group 01, a first redundant electrode pair 201 and/or a second redundant electrode pair 202 is configured to connect the first redundant light-emitting device D1; in the same electrode group 01, the size of the first redundant light-emitting device D1 is the same as the size of the light-emitting device D0 connected to the first initial electrode pair 101 or the second initial electrode pair 102. The light-emitting color of the first redundant light-emitting device D1 is the same as the light-emitting color of the light-emitting device D0.

In the two light-emitting devices D0 corresponding to the initial electrode pair of a certain electrode group 01, when one of the light-emitting devices D0 fails in the light-emitting phase (does not emit light), the first redundant light-emitting device D1 may be introduced at the first redundant electrode pair 201 or the second redundant electrode pair 202, the first redundant light-emitting device D1 may be regarded as a replica of the light-emitting device D0 (which has not failed) at the initial electrode pair of the electrode group 01, to realize a replacement of the light-emitting device D0 that has failed without changing the light-emitting effect of the electrode group as a whole. In one embodiment, in a case that the two light-emitting devices D0 on the initial electrode pairs both fail, the first redundant light-emitting devices D1 may be introduced on the first redundant electrode pair 201 and the second redundant electrode pair 202 respectively. The two first redundant light-emitting devices D1 may be configured to replace the two light-emitting devices D0 on the initial electrode pairs to emit light, to realize the equal-position repair of the light-emitting devices D0

Referring to FIG. 7, in an embodiment, in at least one electrode group 01, a third redundant electrode pair 203 is configured to connect a second redundant light-emitting device D2; in the same electrode group 01, the size of the second redundant light-emitting device D2 is larger than the size of the light-emitting devices D0 connected to the first initial electrode pair 101 and the second initial electrode pair 102. The light-emitting color of the second redundant light-emitting device D2 is the same as the light-emitting color of the light-emitting device D0. The size herein includes at least a length of the corresponding light-emitting device along the first direction, which may also be understood as an area of the corresponding light-emitting device in an orthogonal projection of the light-emitting surface of the display panel.

When the two light-emitting devices D0 corresponding to the initial electrode pair in a certain electrode group 01 fail, a second redundant light-emitting device D2 with a larger size may be introduced on the redundant electrode pair of the electrode group 01. The first redundant electrode 21 and the second redundant electrode 22 form a third redundant electrode pair 203, and the second redundant light-emitting device D2 is electrically connected to the first redundant electrode 21 and the second redundant electrode 22 in the third redundant electrode pair 203. The light-emitting color of the second redundant light-emitting device D2 is the same as the light-emitting color of the light-emitting device D0 on the initial electrode pair. The size may be regarded as the sum of sizes of two light-emitting devices D0 on the initial electrode pair. The second redundant light-emitting device D2 with a larger size is configured to replace the two light-emitting devices D0 connected in series on the initial electrode pair. The light-emitting effect of the corresponding electrode group 01 can also be ensured, and the reliability of repairing the display panel can be improved.

Reference is made to FIG. 7, in an embodiment, in the same electrode group 01, a luminous efficacy of the second redundant light-emitting device D2 is (B1+B2) in unit of cd/A, where B1 and B2 are luminous efficiencies of the light-emitting devices D0 electrically connected to the first initial electrode pair 101 and the second initial electrode pair 102 respectively.

When the second redundant light-emitting device D2 with a larger size is configured to replace the two light-emitting devices D0 on the initial electrode pair to emit light, the embodiment further defines that the current efficiency of the second redundant light-emitting device D2 is the sum of the light-emitting efficiencies of the two light-emitting devices D0 which are replaced, and the same display brightness effect with the two light-emitting devices D0 on the initial electrode pair can be achieved under the driving of the same current. In this way, there is no need to change the circuit structure of the display panel, which is conductive to simplify the process of repairing the display panel.

In addition, when a second redundant light-emitting device D2 with a larger size is configured to replace the two light-emitting devices D0 on the initial electrode pair to emit light, only one transfer operation of the redundant light-emitting devices is required for the electrode group 01, which is helpful for further simplifying the process of repairing the display panel.

Figure 14:
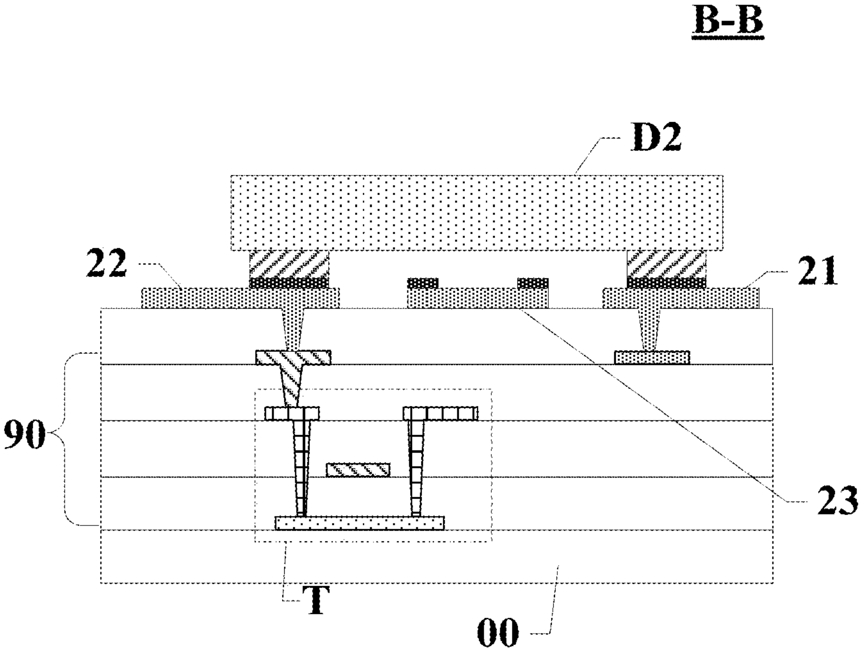
FIG. 14 is a cross-sectional view of the display panel corresponding to FIG. 13 in a direction indicated by BB.

FIG. 14 is a cross-sectional view of the display panel in FIG. 13 along a direction indicated by BB.

Reference is made to FIG. 4 and FIG. 14 in conjunction with FIG. 13, in an embodiment, the display panel includes a substrate 00 and a driving layer 90 located on one side of the substrate, the electrode group 01 is located on one side of the driving layer 90 away from the substrate 00, the driving layer 90 includes multiple driving transistors T; in the same electrode group 01, the second electrode 12 and the second redundant electrode 22 are electrically connected to the driving transistors T, the first electrode 11 and the first redundant electrode 21 receive a fixed electric potential signal.

FIG. 4 illustrates one connection between two light-emitting devices D0 connected in series on an initial electrode pair in the electrode group 01 and the driving layer. FIG. 14 illustrates one connection between the second redundant light-emitting device D2 on the third redundant electrode pair 203 in the electrode group 01 and the driving layer. In the display panel herein, the electrode group 01 is disposed on the side of the driving layer 90 away from the substrate 00, the second electrode 12 and the second redundant electrode 22 in the electrode group 01 are electrically connected to the driving transistor T. That is, the same electrode group 01 correspond to the same driving circuit, it is not necessary to introduce separate driving circuits for the different initial electrode 10 and redundant electrode 20, which is conducive to simplifying the overall structure of the display panel.

In practice, the driving circuit is configured to provide a driving signal to the second electrode 12 on the initial electrode pair, the first electrode 11 is configured to receive a fixed electric potential signal, the second electrode 12 and the first electrode 11 are configured to provide electrical signals to the anode and cathode of the light-emitting device D0 respectively to drive the light-emitting device D0 to emit light. When the light-emitting device D0 on the initial electrode pair fails, the redundant light-emitting device is provided on the redundant electrode pair, since the second redundant electrode 22 in the redundant electrode 20 is connected to the driving transistor, the first redundant electrode 21 is configured to receive the fixed potential signal, the redundant light-emitting device may obtain the driving signal through the second redundant electrode 22 and the first redundant electrode 21 to replace the failed light-emitting device D0 to emit light.

Figure 15:
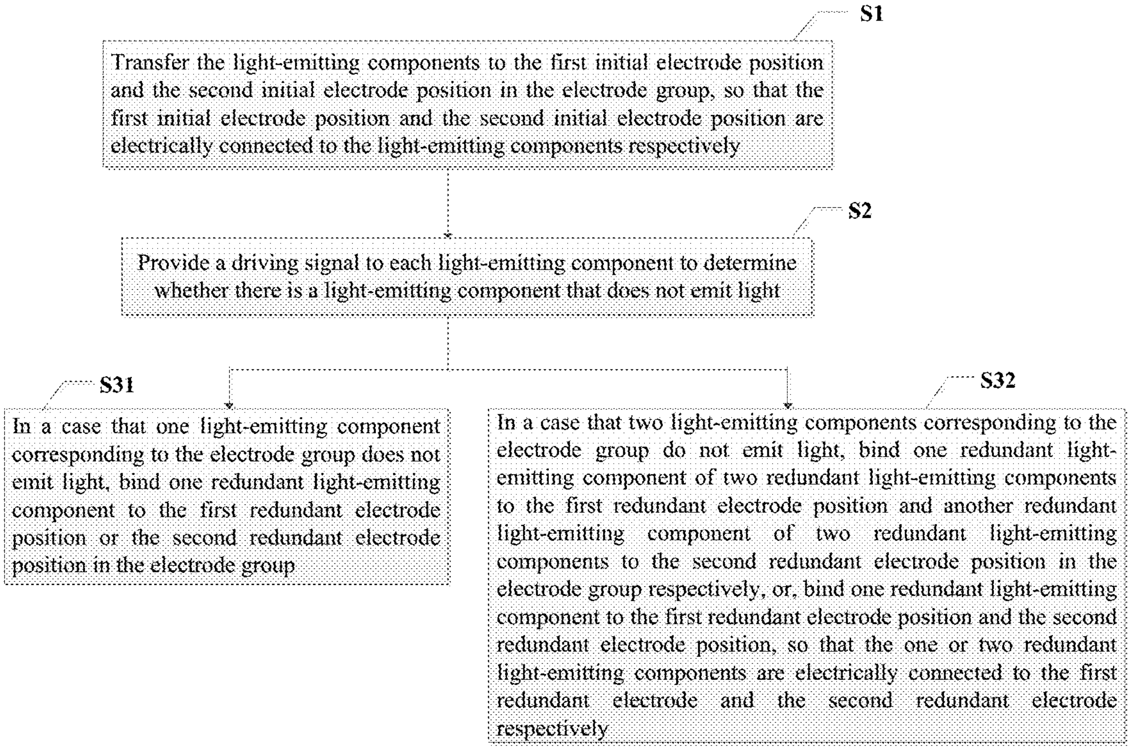
FIG. 15 is a flowchart of a method for repairing the display panel according to an embodiment of the present disclosure.

FIG. 15 is a flowchart of a method for repairing the display panel according to an embodiment of the present disclosure, in conjunction with FIG. 15 and FIG. 2 to FIG. 7, based on the various embodiments, a method for repairing the display panel in any of the above mentioned embodiments is provided according to an embodiment of the present disclosure. The method includes following steps.

In S1, the light-emitting device D0 is transferred to the first initial electrode pair 101 and the second initial electrode pair 102 in the electrode group 01, and the first initial electrode pair 101 and the second initial electrode pair 102 are electrically connected to the corresponding light-emitting device D0 respectively.

In S2, a driving signal is provided to each of the light-emitting devices D0 to determine whether there is a light-emitting device D0 that does not emit light.

In S31, in a case that one light-emitting device D0 corresponding to the electrode group 01 does not emit light, a redundant light-emitting device is bound to the first redundant electrode pair 201 or the second redundant electrode pair 202 in the electrode group.

In S32, in a case that two light-emitting devices D0 corresponding to the electrode group do not emit light, two redundant light-emitting devices are bound to the first redundant electrode pair 201 and the second redundant electrode pair 202 in the electrode group respectively, or, one redundant light-emitting device is bound to the first redundant electrode pair 201 and the second redundant electrode pair 202, and the redundant light-emitting device is electrically connected to the first redundant electrode 21 and the second redundant electrode 22 respectively.

In the process of manufacturing the display panel, the light-emitting devices D0 may be transferred to the initial electrode pairs of each electrode group 01 in the display panel through mass transfer, the light-emitting devices D0 may be electrically connected to the electrodes corresponding to the initial electrode pairs through soldering or other electrical connection. After binding the light-emitting devices D0 is completed, a driving signal is provided to each light-emitting device D0, the light emission of the light-emitting devices D0 may be configured to determine whether the corresponding light-emitting device D0 fails. When the light-emitting device D0 does not emit light, the light-emitting device D0 is considered to be failed, the redundant light-emitting device need to be introduced to replace the failed light-emitting device D0 to emit light. When the light-emitting device D0 emits light, there is no need to introduce redundant light-emitting devices.

Since two light-emitting devices D0 are connected in series on the initial electrode pairs in the electrode group 01, when one light-emitting device D0 fails, referring to FIG. 5, the first redundant light-emitting device D1 may be introduced on the first redundant electrode pair 201 or the second redundant electrode pair 202, the first redundant light-emitting device D1 is configured to replace the failed light-emitting device D0 to emit light. When the two light-emitting devices D0 fail at the initial electrode pairs, referring to FIG. 6, a first redundant light-emitting device D1 may be introduced on the first redundant electrode pair 201 and another first redundant light-emitting device D1 may be introduced on the second redundant electrode pair 202 respectively to emit light, which respectively replace the failed light-emitting devices D0 on the initial electrode pair to emit light. That is, even if both light-emitting devices D0 on the initial electrode pairs do not emit light, there are corresponding electrode pairs in the electrode group 01 to set up the redundant light-emitting devices, to realize the equal-position repair of the light-emitting devices D0. In some other embodiments, referring to FIG. 7, when both light-emitting devices D0 on the initial electrode pairs fail, the second redundant light-emitting device D2 with a larger size may also be introduced on the redundant electrode pair to emit light to replace the failed two light-emitting devices D0. For the electrode group 01, the redundant light-emitting devices need to be transferred only once, thus facilitating simplification of the process of repairing the display panel. In addition, only the electrode group structure herein may realize a variety of methods for repairing as shown in FIG. 5, FIG. 6, and FIG. 7. For the method for repairing shown in FIG. 7, a second redundant light-emitting device with a large size D2 is provided to replace the two light-emitting devices D0 with small size on the initial electrode pair, and an electrode structure to realize such a substitution method is also provided. In practical applications, the methods for repairing may be selected according to actual need. One method is to configure a large-sized second redundant light-emitting device D2 to replace the two light-emitting devices D0 on the initial electrode pairs for repair. Another method is to configure two small-sized first redundant light-emitting devices D1 to replace the two light-emitting devices D0 on the initial electrode pairs for repair. Considering that the two light-emitting devices D0 on the initial electrode pairs in the same electrode group may not fail at the same time, when only one of them fails, the structure of the electrode group provided by the present disclosure is also applicable to the situation where only one light-emitting device needs to be repaired. At this time, a small-sized first redundant light-emitting device D1 is introduced on a redundant electrode pair for repair. Corresponding repaired electrode structures are provided according to embodiments of the present disclosure based on multiple failures of two light-emitting devices connected in series at the initial electrode pair in the same electrode group to meet different repair requirements.

Figure 16:
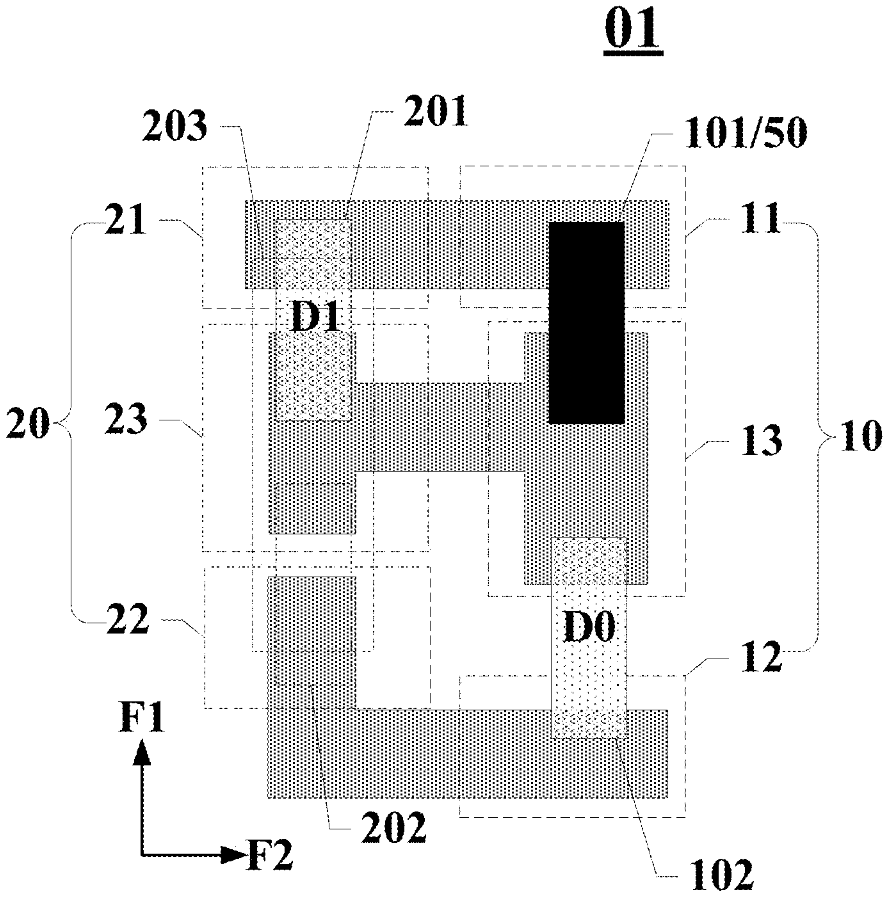
FIG. 16 is a schematic diagram in which a light-blocking material is provided at a corresponding electrode pair after removing a light-emitting device according to an embodiment of the present disclosure.

Reference is made to FIG. 16, which is a schematic diagram in which a light-blocking material 50 is provided at a corresponding electrode pair after removing a light-emitting device D0. In an embodiment, in a case that at least one light-emitting device D0 corresponding to the electrode group 01 does not emit light, the light-emitting device D0 that does not emit light is removed, a region of the electrode pair corresponding to the light-emitting device D0 that does not emit light is covered with the light-blocking material 50.

When it is detected that the light-emitting device D0 on the initial electrode pair does not emit light, removing the light-emitting device D0 that does not emit light is conducive to enhancing the light-emitting stability of the corresponding position of the electrode group 01, and avoids the situation in which the light-emitting device D0 that does not emit light originally on the initial electrode pair unexpectedly emits light in a later stage, which affects the light-emitting brightness of the corresponding position of the electrode group 01. In addition, after removing the failed light-emitting device D0, the initial electrode 10 corresponding to the light-emitting device D0 is covered by a light-blocking material 50 to avoid reflections of the exposed electrode during display of the display panel, which affects the display effect. Although FIG. 16 only shows the solution of covering the light-blocking material 50 on the first electrode pair 101 corresponding to the failed light-emitting device D0, the other exposed electrode portions in the electrode group 01 may also be covered by the light-blocking material 50 for further avoiding the reflection problem.

Figure 17:
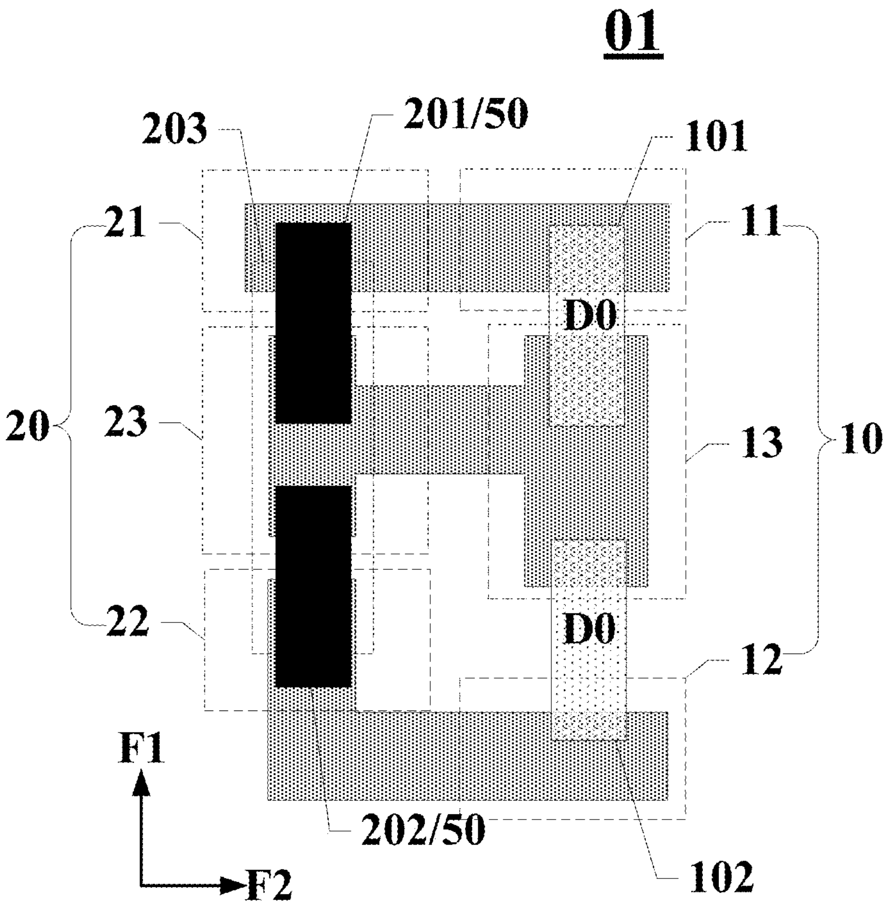
FIG. 17 is a schematic diagram in which a light-blocking material is provided at a corresponding electrode pair after removing a light-emitting device according to an embodiment of the present disclosure.

Reference is made to FIG. 17, which is a schematic diagram in which the light-blocking material 50 is located at a region of the corresponding electrode pair after removing the light-emitting device D0. In an embodiment, after the binding is completed, the method further includes covering the light-blocking material 50 over a region of the first redundant electrode pair 201 and the second redundant electrode pair 202 which are not bound to the redundant light-emitting devices. In the electrode group 01, when the unbound redundant light-emitting devices of the redundant electrodes 20 are exposed, the same problem of reflection during the display of the display panel occurs. Thus, after the repair is completed, the exposed electrode portions are covered with the light-blocking material 50, which is conducive to weakening the reflection problem of the display panel. Although FIG. 17 only illustrates the solution in which the first redundant electrode pair 201 and the second redundant electrode pair 202 which are not bound to the redundant light-emitting device are covered by the light-blocking material 50, the other exposed electrode portions in the electrode group 01 may also be covered by the light-blocking material 50 in order to further avoid the reflection problem.

Referring to FIG. 7, in an embodiment, when two light-emitting devices D0 corresponding to the electrode group 01 do not emit light, a redundant light-emitting device is bound to the corresponding first redundant electrode pair 201 and the second redundant electrode pair 202, the redundant light-emitting device has a luminous efficiency of (B1+B2) in unit of cd/A, where B1 and B2 are luminous efficiencies of the light-emitting devices D0 electrically connected to the first initial electrode pair 101 and the second initial electrode pair 102 respectively.

When a second redundant light-emitting device D2 with a larger size is configured to replace the two light-emitting devices D0 on the initial electrode pair, the present embodiment further defines that the current efficiency of the second redundant light-emitting device D2 is the sum of the light-emitting efficiencies of the two light-emitting devices D0 that are replaced, to achieve the same display brightness effect as the two light-emitting devices D0 on the initial electrode pair under the same current driving without changing the circuit structure of the display panel, to facilitate the simplification of the process of repairing the display panel. In addition, when a second redundant light-emitting device D2 with a larger size is configured to replace the two light-emitting devices D0 on the initial electrode pairs to emit light, only one transfer operation of the redundant light-emitting devices is required for the corresponding electrode group 01, which is conducive to further simplifying the process of repairing the display panel.

Figure 18:
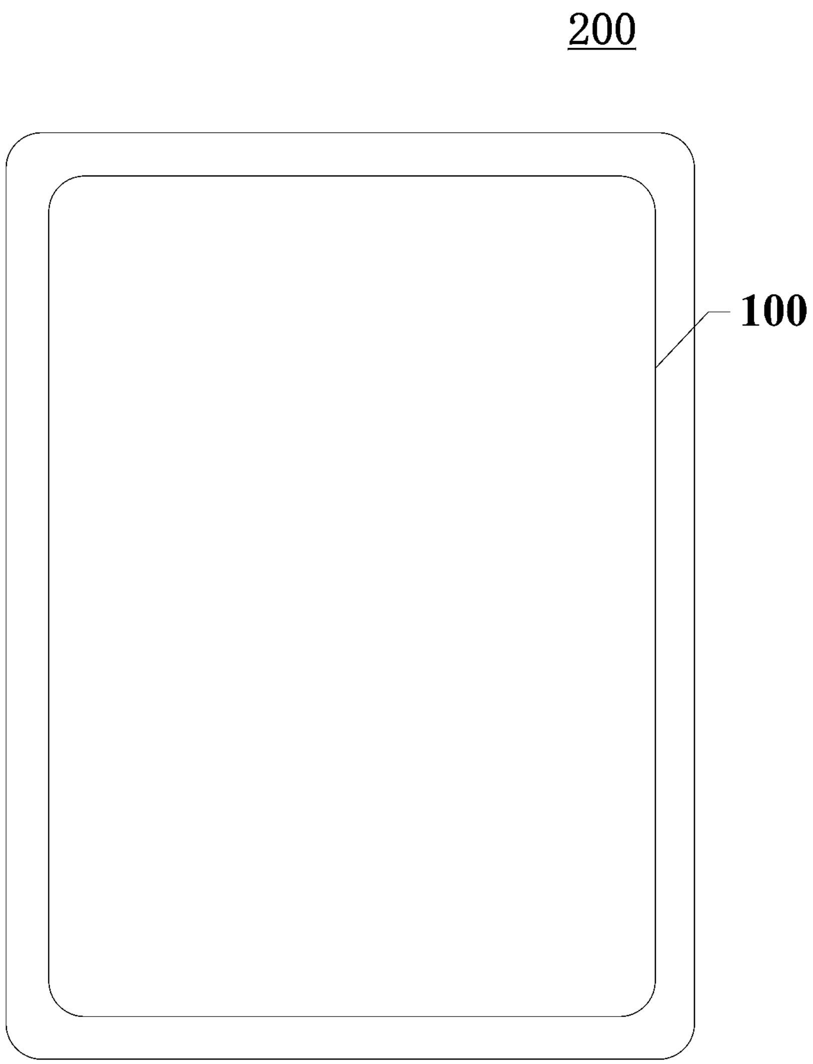
FIG. 18 is a schematic structural diagram of a display device according to an embodiment of the present disclosure.

In some embodiments, a display device is provided according to an embodiment of the present disclosure. FIG. 18 is a schematic structural diagram of a display device according to an embodiment of the present disclosure. The display device 200 includes the display panel 100 according to the above embodiments of the present disclosure.

It is understood that the display device herein may be an e-book reading device, a mobile phone, a tablet, a computer, a television, a vehicle display device, or other display devices with display functions, which is not limited in the present disclosure. The display device herein has the beneficial effects of the display panel herein, which can be described in detail with reference to the above embodiments for the specific description of the display panel, which is not repeated again.

As can be seen from the above embodiments, the display panel, a method for repairing thereof, and a display device herein include at least the following beneficial effects.

In the display panel, the method for repairing thereof, and the display device herein, multiple electrode groups 01 are included. Each electrode group 01 includes an initial electrode 10 and a redundant electrode 20. The initial electrode 10 is configured for electrically connecting to the light-emitting device D0, the redundant electrode 20 is configured for connecting to the redundant light-emitting device when the light-emitting device D0 connected to the initial electrodes 10 fails to emit light normally. The redundant light-emitting device is configured to repairing the light-emitting device D0 on the initial electrodes 10. In the initial electrode 10, a first initial electrode pair 101 formed by the first electrode 11 and the intermediate electrode 13 is configured to connect one light-emitting device D0, and a second initial electrode pair 102 formed by the second electrode 12 and the intermediate electrode 13 is configured to connect another light-emitting device D0, the two light-emitting devices D0 corresponding to the initial electrodes 10 are connected in series. Redundant electrodes 20 are introduced in embodiments of the present disclosure, the first redundant electrode 21 and the intermediate redundant electrode 23 in the redundant electrode 20 form a first redundant electrode pair 201, the second redundant electrode 22 and the intermediate redundant electrode 23 form a second redundant electrode pair 202. In one embodiment, the first redundant electrode 21 and the third redundant electrode 23 form a third redundant electrode pair 203. When the light-emitting device D0 on one initial electrode pair in the same electrode group 01 fails to emit light normally, a first redundant light-emitting device D1 may be introduced on the first redundant electrode pair 201 or the second redundant electrode pair 202, the first redundant light-emitting device D1 may be configured to replace the light-emitting device D0 in the initial electrode pair to emit light. When the two light-emitting devices D0 on the initial electrode pairs in the same electrode group 01 do not emit light, two first redundant light-emitting devices D1 may be introduced and connected to the first redundant electrode pair 201 and the second redundant electrode pair 202 respectively. The two first redundant electrodes 21 may be configured to replace the two light-emitting devices D0 that fail to emit light normally. In one embodiment, a second redundant light-emitting device D2 with a larger size may be introduced and connected to the third redundant electrode pair 203, and the second redundant light-emitting device D2 with a larger size may be configured to replace the two light-emitting devices D0 that fail to emit light normally. Therefore, when one or two light-emitting devices D0 on the initial electrode pair in the electrode group 01 cannot emit light normally, there are corresponding redundant electrode pairs to set corresponding redundant light-emitting devices to replace the light-emitting devices D0 that cannot emit light normally, to realize equal-position repair of the light-emitting devices D0, and thus conducive to enhancing the repair effect of the display panel.

While some particular embodiments of the present disclosure are described in detail by way of examples, the above examples are only for illustrative purposes and are not intended to limit the scope of the present disclosure. Modifications may be made to the above embodiments may be made without departing from the scope and spirit of the present disclosure. The scope of the present disclosure is limited by the appended claims.

The invention claimed is:

1. A display panel, comprising:

a plurality of electrode groups, wherein an electrode group of the plurality of electrode groups is electrically connected to light-emitting devices electrically; and the electrode group comprises an initial electrode and a redundant electrode, wherein:

the initial electrode comprises a first electrode, an intermediate electrode, and a second electrode, the first electrode and the intermediate electrode serves as a first initial electrode pair, the second electrode and the intermediate electrode serve as a second initial electrode pair; in at least a part of the plurality of electrode groups, the first initial electrode pair and the second initial electrode pair are configured to connect different light-emitting devices respectively, a first light-emitting device connected to the first initial electrode pair and a second light-emitting device connected to the second initial electrode pair are connected in series;

the redundant electrode comprises a first redundant electrode, an intermediate redundant electrode and a second redundant electrode, wherein at least one of:

the first redundant electrode and the intermediate redundant electrode serve as a first redundant electrode pair, the second redundant electrode and the intermediate redundant electrode serve as a second redundant electrode pair; or the first redundant electrode and the second redundant electrode serve as a third redundant electrode pair capable; and in the electrode group, the first redundant electrode and the first electrode are both configured to receive a first electric potential, the intermediate redundant electrode and the intermediate electrode are both configured to receive a second electric potential, and the second redundant electrode and the second electrode are both configured to receive a third electric potential.

2. The display panel according to claim 1, wherein in the electrode group, the first redundant electrode and the first electrode are integrated, the intermediate redundant electrode and the intermediate electrode are integrated, and the second redundant electrode and the second electrode are integrated.

3. The display panel according to claim 2, wherein the first electrode, the first redundant electrode, the intermediate electrode, the intermediate redundant electrode, the second electrode and the second redundant electrode are located in a same layer and made of a same material.

4. The display panel according to claim 1, wherein:

the electrode group is divided into a first region, an intermediate region, and a second region, which are arranged in a first direction, and the intermediate region is located between the first region and the second region; and in the electrode group, the first electrode and the first redundant electrode are located at least in the first region, the intermediate electrode and the intermediate redundant electrode are located at least in the intermediate region, and the second electrode and the second redundant electrode are located at least in the second region.

5. The display panel according to claim 4, wherein the electrode group comprises a first electrode portion located in the first region, an intermediate electrode portion located in the intermediate region, and a second electrode portion located in the second region;

the first electrode portion comprises the first electrode and the first redundant electrode, the intermediate electrode portion comprises the intermediate electrode and the intermediate redundant electrode, and the second electrode portion comprises the second electrode and the second redundant electrode; and the electrode group is divided into a third region and a fourth region that are arranged in a second direction, the first redundant electrode, the intermediate redundant electrode and the second redundant electrode are located in the third region, the first electrode, the intermediate electrode and the second electrode are located in the fourth region, the second direction is not parallel with the first direction.

6. The display panel according to claim 5, wherein in the electrode group, a direction of the initial electrode is different from a direction of the redundant electrode.

7. The display panel according to claim 6, wherein in the electrode group, the first redundant electrode, the intermediate redundant electrode, and the second redundant electrode are arranged along the first direction, the first redundant electrode position and the second redundant electrode position are arranged along the first direction; the first electrode and the intermediate electrode are arranged along the second direction, the second electrode and the intermediate electrode are arranged along the second direction, and the first electrode position and the second electrode position are arranged along the first direction.

8. The display panel according to claim 5, wherein the intermediate electrode portion is in a T-shaped structure, the intermediate electrode extends along the first direction, and the intermediate redundant electrode extends along the second direction.

9. The display panel according to claim 5, wherein the intermediate electrode portion is in an H-shaped structure, the intermediate electrode and the intermediate redundant electrode both extend along the first direction, and the intermediate electrode and the intermediate redundant electrode are connected by a first connection portion extending along the second direction.

10. The display panel according to claim 5, wherein:

in the first electrode portion of the electrode group, the first electrode and the first redundant electrode extend along the second direction; or the first redundant electrode extends along the second direction, the first electrode extends along the first direction and the first electrode is located on a side of the first redundant electrode facing the second electrode portion.

11. The display panel according to claim 5, wherein in the second electrode portion of the electrode group, the second electrode extends along the second direction, the second redundant electrode extends along the first direction, and the second redundant electrode is located on a side of the second electrode facing the first electrode portion; or in the second electrode portion of the electrode group, the second electrode and the second redundant electrode both extend along the first direction, the second electrode and the second redundant electrode are connected by a second connection portion extending along the second direction, and the second electrode and the second redundant electrode are located at least on one side of the second connection portion facing the first electrode portion.

12. The display panel according to claim 5, wherein in the electrode group, the intermediate electrode and the intermediate redundant electrode are connected by a first connection portion, the second electrode and the second redundant electrode are connected by a second connection portion, and the first electrode and the first redundant electrode are connected by a third connection portion, an extension direction of the first connection portion, an extension direction of the second connection portion and an extension direction of the third connection portion are parallel.

13. The display panel according to claim 5, wherein the plurality of electrode groups is arranged in an array along the first direction and the second direction, and electrode groups of the plurality of electrode groups, which are located in a same row of the array along the second direction, share the same first electrode portion.

14. The display panel according to claim 13, further comprising one or more connection portions, which extend along the first direction, wherein the first electrode portions are arranged along the first direction and are electrically connected through the one or more connection portions.

15. The display panel according to claim 14, wherein the one or more connection portions and the first electrode portions are located in a same layer and made of a same material.

16. The display panel according to claim 5, wherein in the electrode group, along the first direction, a total dimension Y1 of the first redundant electrode pair and the second redundant electrode pair is less than or equal to a total dimension Y2 of the first initial electrode pair and the second initial electrode pair.

17. The display panel according to claim 1, wherein in at least one of the plurality of electrode groups, the first redundant electrode pair or the second redundant electrode pair is configured to connect a first redundant light-emitting device, and in the electrode group, a size of the first redundant light-emitting device is identical to a size of the first light-emitting device connected to the first initial electrode pair or a size of the second light-emitting device connected to the second initial electrode pair, and the first redundant light-emitting device is configured to emit a light having same color as a light emitted by the first light-emitting device or the second light-emitting device.

18. The display panel according to claim 1, wherein in at least one of the plurality of electrode groups, the third redundant electrode pair is configured to connect a second redundant light-emitting device;

in the electrode group, a size of the second redundant light-emitting device is larger than a size of the first light-emitting device connected to the first initial electrode pair or a size of the second light-emitting device connected to the second initial electrode pair, and the second redundant light-emitting device is configured to emit a light having same color as a light emitted by the first light-emitting device or the second light-emitting device.

19. The display panel according to claim 18, wherein in the electrode group, a luminous efficacy of the second redundant light-emitting device is equal to (B1+B2), wherein B1 and B2 are luminous efficacies of the first light-emitting device and the second light-emitting device respectively.

20. The display panel according to claim 1, further comprising a substrate and a driving layer located on a side of the substrate, wherein:

the plurality of electrode groups is located on a side of the driving layer away from the substrate, the driving layer comprises a plurality of driving transistors, in the electrode group, the second electrode and the second redundant electrode are electrically connected to a corresponding driving transistor of the plurality of driving transistors, and the first electrode and the first redundant electrode are configured to receive a fixed electric potential.

21. A method for repairing a display panel, wherein the display panel comprises a plurality of electrode groups, wherein an electrode group of the plurality of electrode groups is electrically connected to light-emitting devices; and the electrode group comprises an initial electrode and a redundant electrode, wherein:

the initial electrode comprises a first electrode, an intermediate electrode, and a second electrode, the first electrode and the intermediate electrode serves as a first initial electrode pair, the second electrode and the intermediate electrode serve as a second initial electrode pair; in at least a part of the plurality of electrode groups, the first initial electrode pair and the second initial electrode pair are configured to connect different light-emitting devices respectively, a first light-emitting device connected to the first initial electrode pair and a second light-emitting device connected to the second initial electrode pair are connected in series;

the redundant electrode comprises a first redundant electrode, an intermediate redundant electrode and a second redundant electrode; wherein at least one of:

the first redundant electrode and the intermediate redundant electrode serve as a first redundant electrode pair, the second redundant electrode and the intermediate redundant electrode serve as a second redundant electrode pair; or the first redundant electrode and the second redundant electrode serve as a third redundant electrode pair device; and in the electrode group, the first redundant electrode and the first electrode are both configured to receive a first electric potential, the intermediate redundant electrode and the intermediate electrode are both configured to receive a second electric potential, and the second redundant electrode and the second electrode are both configured to receive a third electric potential;

wherein the method comprises:

for the electrode group, transferring two light-emitting devices to the first initial electrode pair and the second initial electrode pair to connect the first initial electrode pair and the second initial electrode pair electrically to the two light-emitting devices, respectively;

providing a driving signal to a light-emitting device of the two light-emitting devices to determine whether any of the two light-emitting devices does not emit light;

in response to either of the two light-emitting devices not emitting light, binding a redundant light-emitting device to the first redundant electrode pair or the second redundant electrode pair;

in response to both of the two light-emitting devices not emitting light, binding two redundant light-emitting devices to the first redundant electrode pair and the second redundant electrode pair, respectively, or, binding a redundant light-emitting device to the third redundant electrode pair wherein the redundant light-emitting device is electrically connected to both the first redundant electrode and the second redundant electrode.

22. The method according to claim 21, further comprising:

in response to at least one of the two light-emitting devices corresponding to the electrode group not emitting light, removing the at least one of the two light-emitting devices to expose a region on the display panel, and covering the region with a light-blocking material.

23. The method according to claim 21, further comprising;

covering, after binding the redundant light-emitting device, a region of an electrode pair of the first redundant electrode pair and the second redundant electrode pair, to which the redundant light-emitting device is not bound, with a light-blocking material.

24. The method according to claim 21, wherein:

in response to both of the two light-emitting devices not emitting light, binding a redundant light-emitting device to the first redundant electrode pair and the second redundant electrode pair, wherein a luminous efficacy of the redundant light-emitting device is equal to (B1+B2), wherein B1 and B2 are luminous efficacies of the first light-emitting device and the second light-emitting device respectively.

25. A display device, comprising the display panel, wherein the display panel comprises a plurality of electrode groups, wherein an electrode group of the plurality of electrode groups is electrically connected light-emitting devices; and the electrode group comprises an initial electrode and a redundant electrode, wherein:

the initial electrode comprises a first electrode, an intermediate electrode, and a second electrode, the first electrode and the intermediate electrode serves as a first initial electrode pair, the second electrode and the intermediate electrode serve as a second initial electrode pair; in at least a part of the plurality of electrode groups, the first initial electrode pair and the second initial electrode pair are configured to connect different light-emitting devices respectively, a first light-emitting device connected to the first initial electrode pair and a second light-emitting device connected to the second initial electrode pair are connected in series;

the redundant electrode comprises a first redundant electrode, an intermediate redundant electrode and a second redundant electrode; wherein at least one of:

the first redundant electrode and the intermediate redundant electrode serve as a first redundant electrode pair, the second redundant electrode and the intermediate redundant electrode serve as a second redundant electrode pair; or the first redundant electrode and the second redundant electrode serve as a third redundant electrode pair; and in the electrode group, the first redundant electrode and the first electrode are both configured to receive a first electric potential, the intermediate redundant electrode and the intermediate electrode are both configured to receive a second electric potential, and the second redundant electrode and the second electrode are both configured to receive a third electric potential.

* * * * *